United States Patent
Kawano et al.

(10) Patent No.: US 7,576,392 B2
(45) Date of Patent: Aug. 18, 2009

(54) SEMICONDUCTOR DEVICE INCLUDING GATE WIRING, MAIN ELECTRODES AND CONNECTING PLATE CONNECTED ONTO SAID MAIN ELECTRODES

(75) Inventors: Takahiro Kawano, Kanagawa (JP); Kenichi Ogata, Kanagawa (JP); Tatsuo Yoneda, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/612,925

(22) Filed: Jul. 7, 2003

(65) Prior Publication Data
US 2004/0016979 A1 Jan. 29, 2004

(30) Foreign Application Priority Data
Jul. 23, 2002 (JP) ............................ 2002-213331
Oct. 9, 2002 (JP) ............................ 2002-295629

(51) Int. Cl.
*H01L 29/76* (2006.01)
(52) U.S. Cl. .................... 257/341; 257/335; 257/342; 257/343
(58) Field of Classification Search ......... 257/329–334, 257/341–342, 773–774, 666
See application file for complete search history.

(56) References Cited
U.S. PATENT DOCUMENTS
6,025,646 A * 2/2000 Sakai et al. ................. 257/774

| | | | |
|---|---|---|---|
| 6,285,058 B1 * | 9/2001 | Narazaki et al. | 257/330 |
| 6,316,814 B1 * | 11/2001 | Nagata et al. | 257/435 |
| 6,342,709 B1 * | 1/2002 | Sugawara et al. | 257/139 |
| 6,396,127 B1 | 5/2002 | Munoz et al. | |
| 6,606,120 B1 * | 8/2003 | Merrill et al. | 348/273 |
| 6,855,957 B1 * | 2/2005 | Yamazaki et al. | 257/72 |
| 6,862,070 B1 * | 3/2005 | Sugimoto et al. | 349/149 |
| 6,864,508 B2 * | 3/2005 | Yamazaki et al. | 257/79 |
| 2004/0026753 A1 | 2/2004 | Matsuki et al. | |

FOREIGN PATENT DOCUMENTS
JP 2000-114445 4/2000
JP 2002-314018 10/2002

* cited by examiner

*Primary Examiner*—Ori Nadav
(74) *Attorney, Agent, or Firm*—Oblon, Spivak, McClelland, Maier & Neustadt, P.C.

(57) ABSTRACT

A semiconductor device disclosed herein comprises a semiconductor layer which includes a first semiconductor region of a first conductivity type, a base region of a second conductivity type, and a plurality of second semiconductor regions of the first conductivity type; a gate wiring which is formed on the semiconductor layer via a first insulating film; a plurality of main electrodes which are electrically connected to the plurality of second semiconductor regions and which are insulated from the gate wiring, wherein the gate wiring is arranged between the main electrodes and upper surfaces of the main electrodes are higher than an upper surface of the uppermost layer of the gate wiring; and a connecting plate which is directly connected onto uppermost layers of the main electrodes.

27 Claims, 26 Drawing Sheets

SEMICONDUCTOR DEVICE INCLUDING GATE WIRING, MAIN ELECTRODES AND CONNECTING PLATE CONNECTED ONTO SAID MAIN ELECTRODES

CROSS REFERENCE TO RELATED APPLICATION

This application claims benefit of priority under 35 U.S.C. § 119 to Japanese Patent Applications No. 2002-213331, filed on Jul. 23, 2002, and No. 2002-295629, filed on Oct. 9, 2002, the entire contents of which are incorporated by reference herein.

BACKGROUND OF THE INVENTION

1. Field of the Invention

The present invention relates to a semiconductor device to which a semiconductor chip having a cell such as a MOS-type power device is incorporated.

2. Related Art

In recent years, scale-down is demanded from a power device such as a vertical MOSFET, and a reduction in the value of internal resistance (on-state resistance or the like) of the entire semiconductor device including the aforementioned device is also strongly demanded. FIG. 20 shows an example of a related semiconductor device. Here, 2001 denotes a semiconductor substrate, 2002 denotes a source electrode, 2003 denotes a lead frame, 2004 denotes a source wire, 2005 denotes a gate wire, and 2006 denotes a gate wiring.

A lead-out wiring region and a cell forming region are provided on the surface of a semiconductor chip, and a cell such as a MOSFET is formed in the cell forming region. The source electrode 2002 and the lead frame 2003 are connected by a plurality of source wires 2004. The source electrode is required to pass more current than a gate electrode, but since it is connected by the wires, the cross-sectional area of a current path is small, and hence the resistance value is high. To reduce this resistance value, there is a technique in which a reduction in on-state resistance is achieved by a structure in which the source electrode and the lead frame are connected by an almost platy conductive plate. Hereinafter, this almost platy conductive plate is called a strap. Moreover, the structure in which the source electrode and the lead frame are connected by the strap is called a strap structure. For example, in Japanese Patent Laid-open No. 2000-114445, a method of connecting a Cu strap onto an electrode on the surface of a semiconductor chip by an Ag paste as an adhesive is disclosed.

This method has the following problem depending on conditions. Namely, if a temperature cycling test, one of common reliability tests of a semiconductor device, in which the semiconductor device is disposed under an environment with a wide range of temperature and a sharp temperature change, is repeated a plurality of times, there arises a problem that a fault such as cracking occurs in the vicinity of an interface since thermal efficient coefficients of an electrode member, the adhesive, and the strap are different from one another, whereby the life of the semiconductor device is shortened.

As a technique to solve this problem, a method of directly connecting the strap to the electrode on the surface of the semiconductor chip by ultrasonic bonding is newly proposed. FIG. 21 is a fragmentary sectional view of a related semiconductor device and shows a lead-out wiring region including a gate wiring and the like. It shows a region corresponding to the line A-A' in FIG. 20, and it is a sectional view of a first lead-out wiring region sandwiched between source electrodes out of the lead-out wiring region. A device such as a MOSFET is formed in another cell forming region, and an N-type source region (not shown) is selectively formed on the surface of a P-type base region 2102 formed on a semiconductor substrate 2101. A first insulating film 2103 is formed on the P-type base region 2102. A first gate wiring 2104 is formed on part of the first insulating film 2103, and the first gate wiring 2104 is connected to a gate electrode (not shown) such as the MOSFET formed in another cell forming region.

A first interlayer dielectric 2106 is formed on a side surface and part of an upper surface of the first gate wiring 2104 for insulation from a source electrode 2105. A second gate wiring 2107 made of Al (Aluminum) is formed on the upper surface of the first gate wiring 2104 on which the first interlayer dielectric 2106 is not formed. The source electrode 2105 is formed on the P-type base region 2102 and the N-type source region. An upper surface of the second gate wiring 2107 is formed higher than an upper surface of the source electrode 2105. A protective film 2108 such as polyimide is formed on part of the source electrode 2105 and on the second gate wiring 2107. The protective film 2108 is formed in order to prevent a short-circuit between the second gate wiring 2107 and a strap formed thereabove, a short-circuit between the second gate wiring 2107 and the source electrode 2105, corrosion of Al, and the like. The source electrode 2105 is connected to a strap 2109 by ultrasonic bonding.

FIG. 22 is a fragmentary sectional view of the related semiconductor device and shows another lead-out wiring region including the gate wiring and the like. It is a sectional view of a region corresponding to the line B-B' in FIG. 20 and shows an outer peripheral region of the cell forming region out of the lead-out wiring region. It is a sectional view of a second lead-out wiring region in which a gate electrode and the lead frame are connected by the gate wire.

A first insulating film 2202 is formed on a semiconductor substrate 2201. A first gate wiring 2203 is formed on part of the first insulating film 2202, and a first interlayer dielectric 2204 is formed on a side surface and part of an upper surface of the first gate wiring 2203. A second gate wiring 2205 made of Al is formed on the upper surface of the first gate wiring 2203 on which the first interlayer dielectric 2204 is not formed, and an end portion of the second gate wiring 2205 is formed to extend onto the first insulating film 2202. A wiring portion which extends onto the first insulating film 2202 is used as a gate electrode 2207. A source electrode 2206 is formed apart from the gate electrode 2207, and a protective film 2208 such as polyimide is formed on part of the source electrode 2206 and on part of the gate electrode 2207 in order to prevent a short-circuit between the gate electrode 2207 and the source electrode 2206 and corrosion of Al. The source electrode 2206 is connected to the strap by ultrasonic bonding, and the gate electrode 2207 is connected to the gate wire (not shown). A stopper region 2209 is formed in a surface region of an outer peripheral edge of the semiconductor substrate 2201.

FIG. 23 to FIG. 25 show a method of manufacturing a semiconductor device in the first and second lead-out wiring regions shown in FIG. 21 and FIG. 22. The cell forming region is omitted.

As shown in FIG. 23, a P-type base region 2302 is formed on a semiconductor substrate 2301 in the first lead-out wiring region. Subsequently, first insulating films 2303a and 2303b are formed on the P-type base region 2302 and the semiconductor substrate 2301 of the first and second lead-out wiring regions, respectively. Polysilicon is deposited on the first insulating films 2303a and 2303b and etched to form first gate wirings 2304*a* and 2304*b* on part of each of the first insulating films 2303*a* and 2303*b* in the first and second lead-out wiring regions. Silicon nitride films are formed on upper surfaces and side surfaces of the first gate wirings 2304*a* and 2304*b* and etched to form first interlayer dielectrics 2305*a* and 2305*b* having slot portions such that part of each of the upper surfaces of the, first gate wirings 1204*a* and 1204*b* is exposed.

Then, Al is deposited and etched to form a second gate wiring 2306*a* in the first lead-out wiring region and a gate electrode 2307 integrated with a second gate wiring 2306*b* in the second lead-out wiring region. A source electrode 2308 is formed in the cell forming region (only part of the source electrode is shown). The gate electrode 2307 formed in the second lead-out wiring region is formed on the first insulating film 2303*b*. The source electrode 2308 is formed apart from the second gate wiring 2306*a* and the gate electrode 2307. A stopper region 2309 is formed in a surface region of an outer peripheral edge of the second lead-out wiring region.

Next, as shown in FIG. 24, polyimide 2310 is deposited in the first and second lead-out wiring regions.

Thereafter, by applying a resist film and forming a resist pattern, a protective film such as covers the gate wiring and a protective film 2311 such that part of the upper surface of the gate electrode is exposed are formed as shown in FIG. 25. Subsequently, the strap (not shown) is formed on the cell forming region and the first lead-out wiring region, and the gate wire (not shown) is formed on the gate electrode 2307 formed in the second lead-out wiring region and connected to the lead frame.

However, reliability to heat increases dramatically in ultrasonic bonding, but since the strap is bonded by applying ultrasonic waves to a predetermined region of the strap, if the ultrasonic waves are applied to a region on the projecting gate wiring in the first lead-out wiring region, a large shock is applied to the protective film on the gate wiring. Consequently, the projecting gate wiring is crushed, and the gate wiring and the source electrode are deformed, which causes a problem that a short-circuit between the gate wiring and the source electrode occurs, or the protective film formed on the gate wiring deteriorates to cause a short-circuit between the strap and the gate wiring. The aforementioned problem does not arise unless the projecting upper-layer gate wiring with low resistance is formed in the upper portion, but there is a problem that the existence of the upper-layer gate wiring exerts a large influence on internal resistance, and if the upper-layer gate wiring is not formed, for example, a resistance value of approximately 1.5 Ω increases to 3 Ω which is almost twice. In a power MOSFET especially used for synchronous rectification in recent years, an increase in resistance value lowers conversion efficiency, and hence it is not suitable for this use.

SUMMARY OF THE INVENTION

In order to accomplish the aforementioned and other objects, according to one aspect of the present invention, a semiconductor device, comprises a semiconductor layer which includes a first semiconductor region of a first conductivity type, a base region of a second conductivity type, and a plurality of second semiconductor regions of the first conductivity type;

a gate wiring which is formed on the semiconductor layer via a first insulating film;

a plurality of main electrodes which are electrically connected to the plurality of second semiconductor regions and which are insulated from the gate wiring, wherein the gate wiring is arranged between the main electrodes and upper surfaces of the main electrodes are higher than an upper surface of the uppermost layer of the gate wiring; and a connecting plate which is directly connected onto uppermost layers of the main electrodes.

According to another aspect of the present invention, a semiconductor device, comprises:

a semiconductor layer which includes a first semiconductor region of a first conductivity type, a base region of a second conductivity type, and a cell forming region in which a plurality of second semiconductor regions of the first conductivity type are formed;

a first gate electrode which is formed in the cell forming region and controls continuity/non-continuity between the first semiconductor region and the second semiconductor region;

a plurality of main electrodes which are electrically connected to the plurality of second semiconductor regions respectively and which are formed at predetermined intervals in the cell forming region on the semiconductor layer;

a gate wiring which is formed on the semiconductor layer between the plurality of main electrodes via a first insulating film and which leads out the first gate electrode to an outer peripheral region of the cell forming region, wherein upper surfaces of the uppermost layers of the plurality of main electrodes are higher than an upper surface of the uppermost layer of the gate wiring; and a first connecting plate which is directly connected onto the plurality of main electrodes.

According to a further aspect of the present invention, a semiconductor device, comprises:

a first semiconductor layer of a first conductivity type;

a second semiconductor layer of a second conductivity type which is formed on the first semiconductor layer;

a first semiconductor region of the first conductivity type which is formed in a first cell forming region in the second semiconductor layer;

a second semiconductor region of the first conductivity type which is formed in a second cell forming region in the second semiconductor layer;

a first gate electrode which is formed in the first cell forming region and controls continuity/non-continuity between the first semiconductor region and the first semiconductor layer;

a second gate electrode which is formed in the second cell forming region and controls continuity/non-continuity between the second semiconductor region and the first semiconductor layer;

a first main electrode which is electrically connected to the first semiconductor region and formed in the first cell forming region on the second semiconductor layer;

a second main electrode which is electrically connected to the second semiconductor region and formed in the second cell forming region on the second semiconductor layer;

a gate wiring which is formed on the second semiconductor layer between the first main electrode and the second main electrode via a first insulating film and which leads out the first and second gate electrodes to an outer peripheral region of the first and second cell forming regions, wherein an upper surface of the uppermost layer of the first main electrode and an upper surface of the uppermost layer of the second main electrode are higher than an upper surface of the uppermost layer of the gate wiring; and a first connecting plate which is directly connected onto the first main electrode and the second main electrode.

DETAILED DESCRIPTION OF THE EMBODIMENTS

Embodiments will be described in detail below.

First Embodiment

First, a semiconductor device of the first embodiment will be explained with reference to FIG. 1 to FIG. 8.

Figure 1:
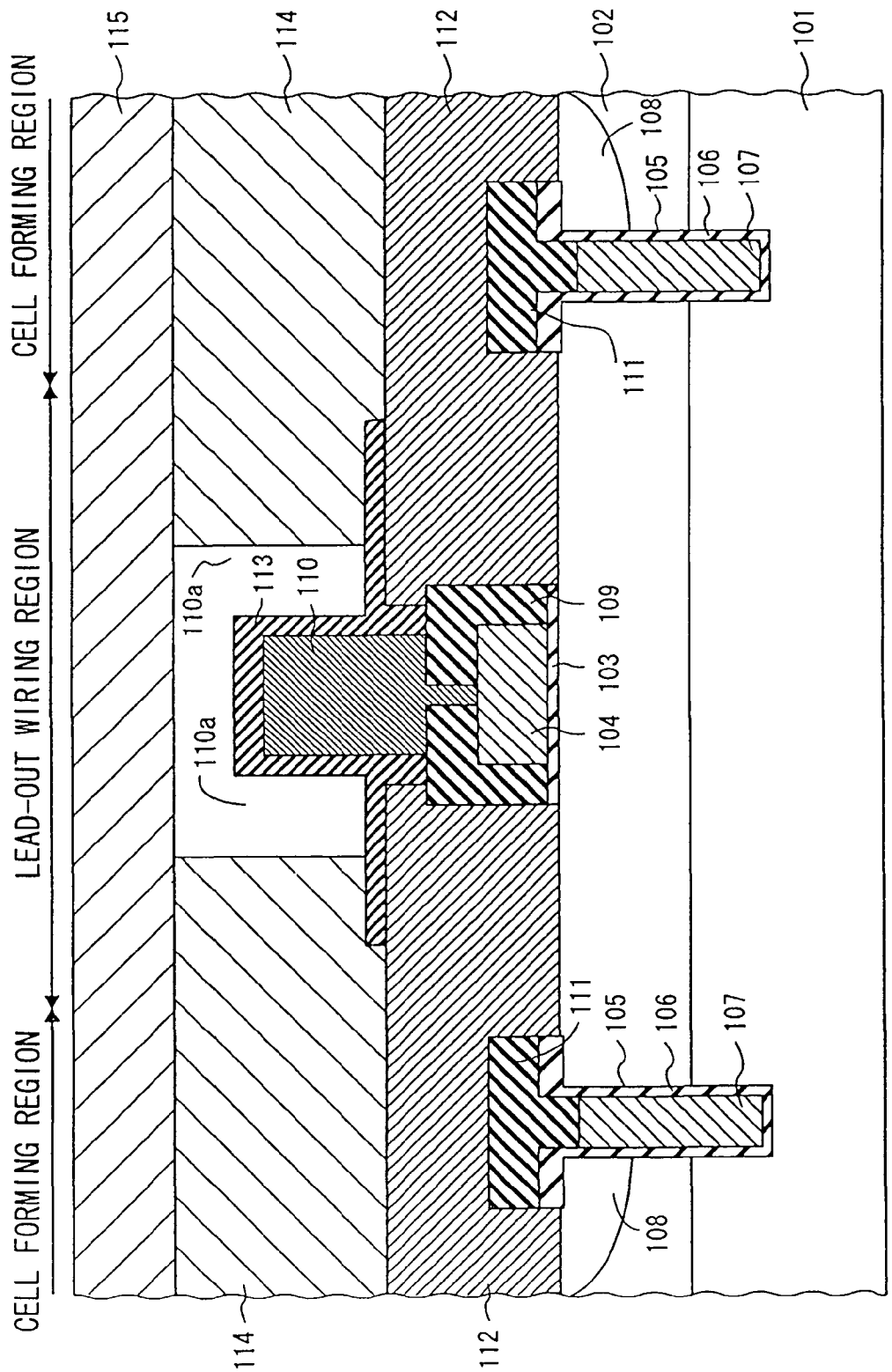
FIG. 1 is a fragmentary sectional view taken along the line A-A' of a semiconductor device in FIG. 8 according to a first embodiment.

In this embodiment, the explanation is given with a MOSFET and an IGBT as its examples. FIG. 1 is a sectional view taken along the line A-A' in FIG. 8. As shown in FIG. 1, a first insulating film 103 is formed, for example, on a P-type base region 102 of a lead-out wiring region which is formed on an N-type semiconductor substrate 101 and sandwiched between cell forming regions. A first gate wiring 104 is formed on the first insulating film 103.

A trench 105 is formed perpendicular and parallel to the first gate wiring 104 in the P-type base region 102 of the cell forming region. The trench 105 has an off set mesh trench structure. Incidentally, FIG. 1 is a fragmentary sectional view of a region in which the trench 105 is formed parallel to the first gate wiring 104. A gate insulating film 106 is formed in the trench 105, and a trench gate electrode 107 is buried in the trench 105 in such a manner as to touch the gate insulating film 106. An N-type source region 108 is formed on the surface of the P-type base region 102 around the trench 105. The N-type source region 108 is not formed around the trench 105 on the lead-out wiring region side.

A cell formed in the cell forming region functions as a MOSFET if an N$^+$-type drain region is formed under the semiconductor substrate 101 and a drain electrode is formed so as to touch the N$^+$-type drain region, and functions as an IGBT (Insulated Gate Bipolar Transistor) if a P$^+$-type collector region is formed under the semiconductor substrate 101 and a collector electrode is formed so as to touch the P$^+$-type collector region. The cell formed in the cell forming region is not limited to the above. The structure of the cell is not limited to a trench type, and may be a planer type.

The first gate wiring 104 and the trench gate electrode 107 are formed of a conductive material such as polysilicon and electrically connected to each other in another region (not shown).

A first interlayer dielectric 109 such as a UDO (Undoped Oxide) or a BPSG is formed on a side surface and part of an upper surface of the first gate wiring 104. On the first gate wiring 104 on which the first interlayer dielectric 109 is not formed, a second gate wiring 110 formed of a conductive material such as Al is formed and used as a lead-out wiring for the first gate wiring 104 and the trench gate electrode 107. The first insulating film 103 and the first interlayer dielectric 109 may be integrally formed by an insulating film made of the same material. A second interlayer dielectric 111 is formed on the trench gate electrode 107. The second interlayer dielectric 111 may be completely buried in the trench 105.

A first source electrode 112 such as Al is formed on the P-type base region 102 and the N-type source region 108. The first source electrode 112 is formed so as to have a large area, which leads to a reduction in resistance. The first source electrode 112 is formed to be insulated from the first gate wiring 104 by the first interlayer dielectric 109 and insulated from the trench gate 107 by the second-interlayer dielectric 111. On part of an upper surface of the first source electrode 112 and a side surface and an upper surface of the second gate wiring 110, a second insulating film 113 is formed in order to, when an almost platy connecting plate (here called a strap) is connected by ultrasonic bonding, prevent a short-circuit between the second gate wiring 110 and the strap and a short-circuit between the first source electrode 112 and the second gate wiring 110.

Although the second insulating film 113 is also formed on part of the upper surface of the first source electrode 112, it may not be formed thereon. However, by forming the insulating film to extend onto part of the upper surface of the first source electrode 112 as described above, a short-circuit fault caused by misalignment in patterning can be prevented, whereby a device with high yield and high reliability can be manufactured. The second insulating film 113 is composed of a silicon oxide film, a silicon nitride film, or a stacked film thereof. It is desirable to use an insulating film with a certain degree of hardness as the second insulating film 113 since an electrode layer is formed thereon. The thickness of the second insulating film 113 is preferably 2 μm to 4 μm.

A second source electrode 114 such as Al is formed on the first source electrode 112 and the second insulating film 113 which is formed on the first source electrode 112. The second gate wiring 110 and the second source electrode 114 are arranged with a gap 110a between them. The second source electrode 114 is formed thicker than the first source electrode 112 on the N-type source region 108.

Deterioration such as deformation in an interface between different kinds of materials and an increase in resistance can be prevented by forming the first source electrode 112 and the second source electrode 114 out of the same conductive material.

Moreover, in this embodiment, an upper surface of the second source electrode 114 is formed higher than an upper surface of the second gate wiring 110. The upper surface of the second source electrode 114 may be on the same level with the upper surface of the second insulating film 113 on the second gate wiring 110. However, it is preferable that the upper surface of the second source electrode 114 be formed higher than the upper surface of the second insulating film 113 on the second gate wiring 110.

A strap 115 which connects with the second source electrode 114 is formed on the second source electrode 114. The strap 115 is a connecting plate, for example, made of Al. The strap 115 is connected, for example, to a lead frame (not shown) for connection to the outside.

Next, a method of manufacturing a first lead-out wiring region including the gate wiring of the semiconductor device described in this embodiment will be explained by FIG. 2 to FIG. 7.

Figure 2:
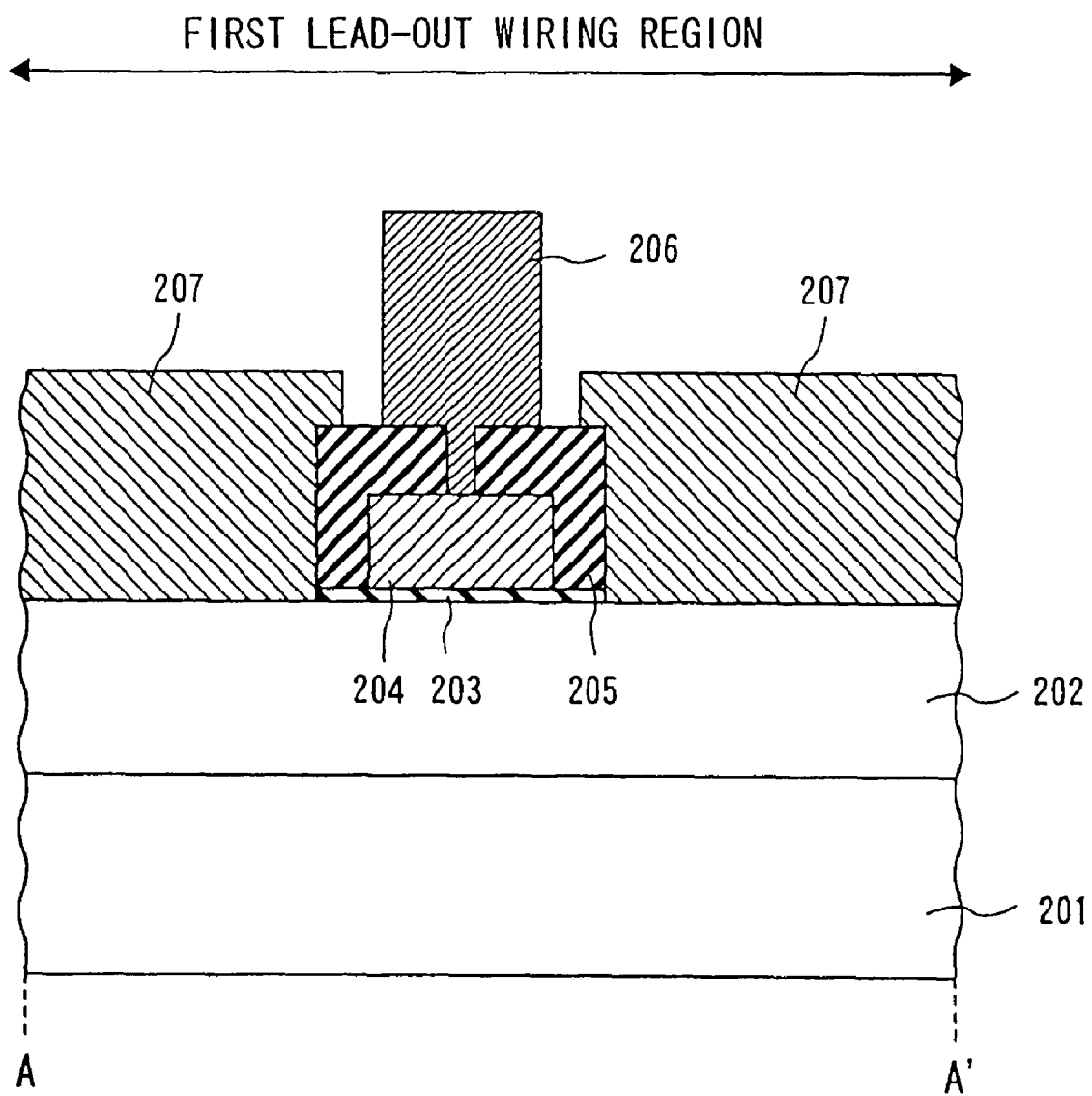
FIG. 2 is a fragmentary sectional view showing one step of the process of manufacturing the semiconductor device according to the first embodiment.

Thermal diffusion is performed, for example, by selectively ion-implanting an N-type impurity in the surface of a P-type base region 202 formed on an N-type semiconductor substrate 201 to thereby form an N-type source region (not shown) in a predetermined region of the cell forming region. Then, as shown in FIG. 2, a first insulating film 203 is formed on the P-type base region 202. A first gate wiring 204 is formed using a conductive material such as polysilicon on part of the first insulating film 203. The first gate wiring 204 is connected to a trench gate electrode (not shown) formed in the cell forming region such as a trench MOSFET. A first interlayer dielectric 205 is formed on a side surface and an upper surface of the first gate wiring 204 on the first insulating film 203.

Subsequently, a slot portion is formed in the first interlayer dielectric 205 such that the upper surface of the first gate wiring 204 is exposed. Then, a second gate wiring 206 is formed to fill at least the slot portion and electrically connected to the first gate wiring 204. The second gate wiring 206 is formed of a conductive material such as Al and used as a lead-out wiring. A first source electrode 207 is then formed on the P-type base region 202 and the N-type source region (not shown).

Figure 3:
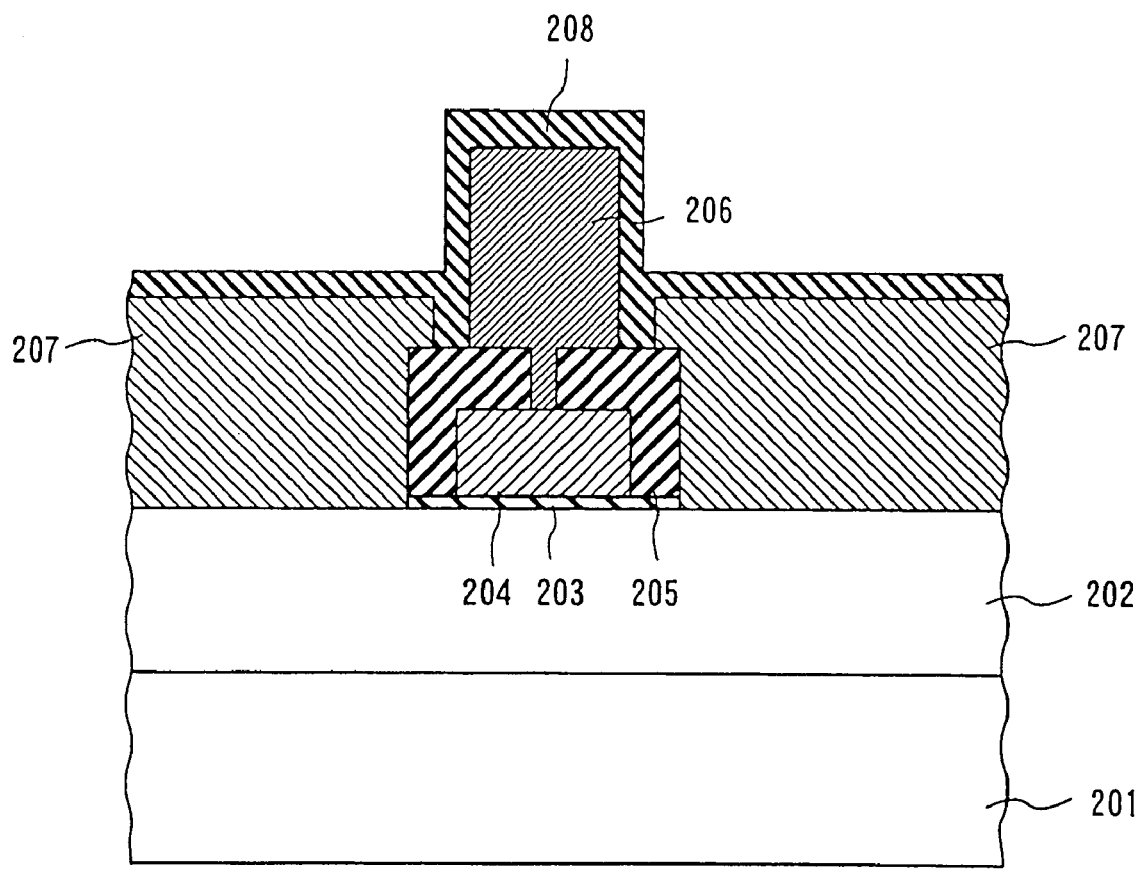
FIG. 3 is a fragmentary sectional view showing one step of the process of manufacturing the semiconductor device according to the first embodiment.

Thereafter, as shown in FIG. 3, a second insulating film 208 such as a silicon oxide film or a silicon nitride film is formed in such a manner as to cover part of the first source electrode 207 and an upper surface and a side surface of the second gate wiring 206.

Figure 4:
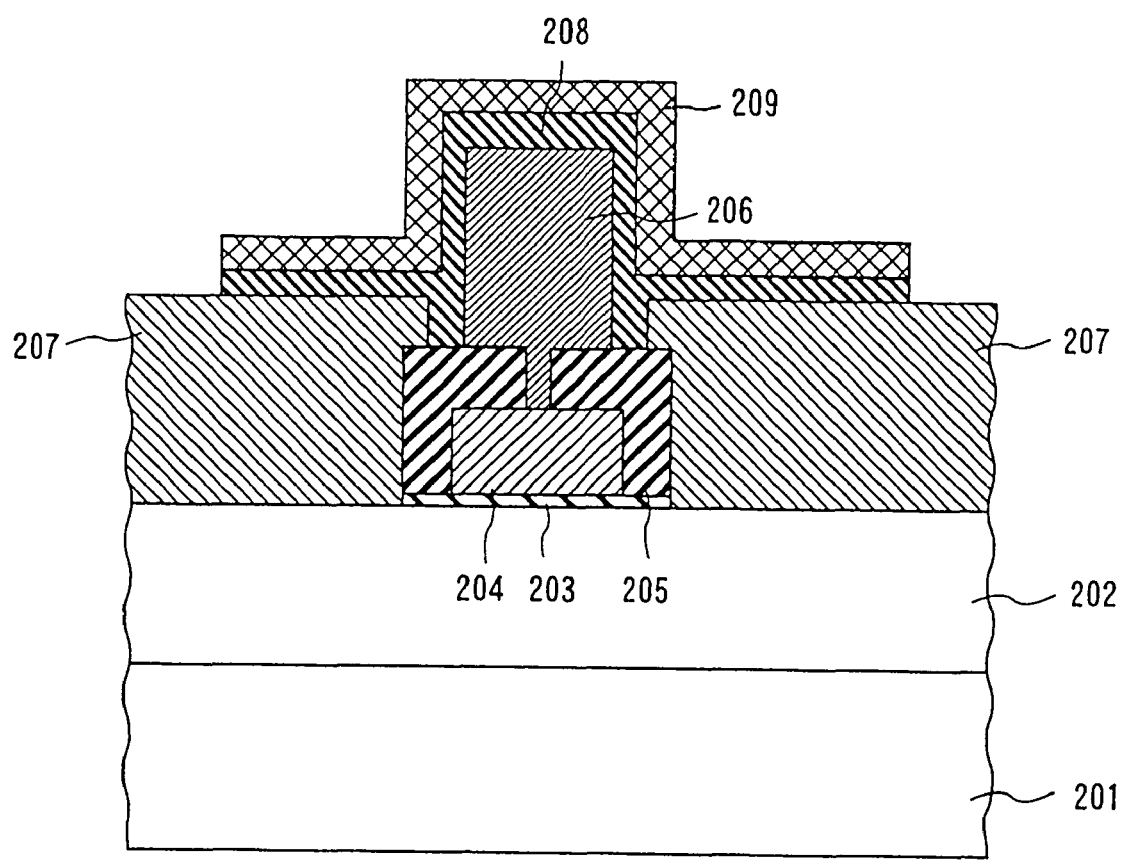
FIG. 4 is a fragmentary sectional view showing one step of the process of manufacturing the semiconductor device according to the first embodiment.

Then, as shown in FIG. 4, a resist film 209 is applied onto the second insulating film 208 and patterned, so that a pattern of the second insulating film 208 is formed on the second gate wiring 206 and the first interlayer dielectric 205.

Figure 5:
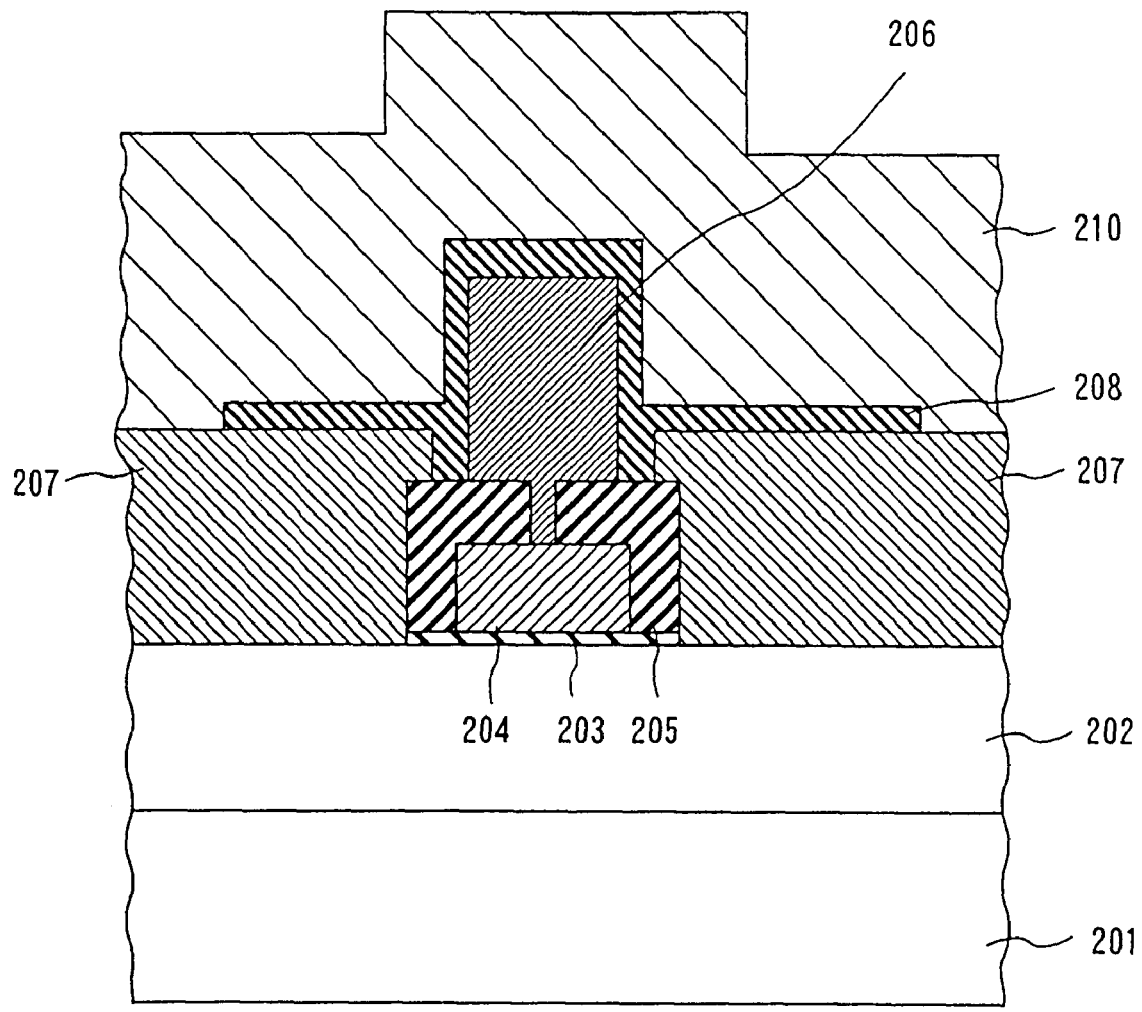
FIG. 5 is a fragmentary sectional view showing one step of the process of manufacturing the semiconductor device according to the first embodiment.

Subsequently, as shown in FIG. 5, the resist film 209 is ashed, and a second source electrode 210 is formed on an exposed part of the first source electrode 207 and on the second insulating film 208.

Figure 6:
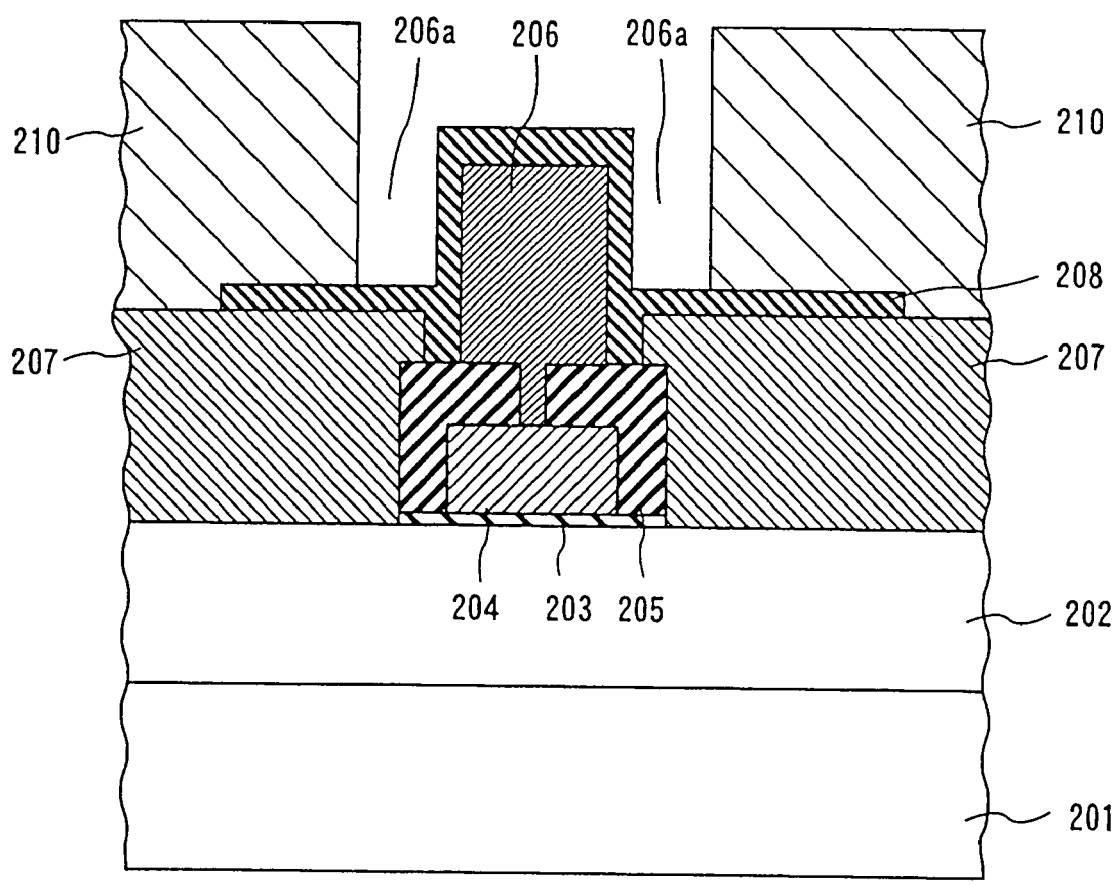
FIG. 6 is a fragmentary sectional view showing one step of the process of manufacturing the semiconductor device according to the first embodiment.

Next, as shown in FIG. 6, the second source electrode 210 is etched, and a gap 206a is formed such that the second insulating film 208 on the second gate wiring 206 and part of the second insulating film 208 on the first source electrode 208 are exposed. An upper surface of the second source electrode 210 is formed higher than the upper surface of the second gate wiring 206.

Figure 7:
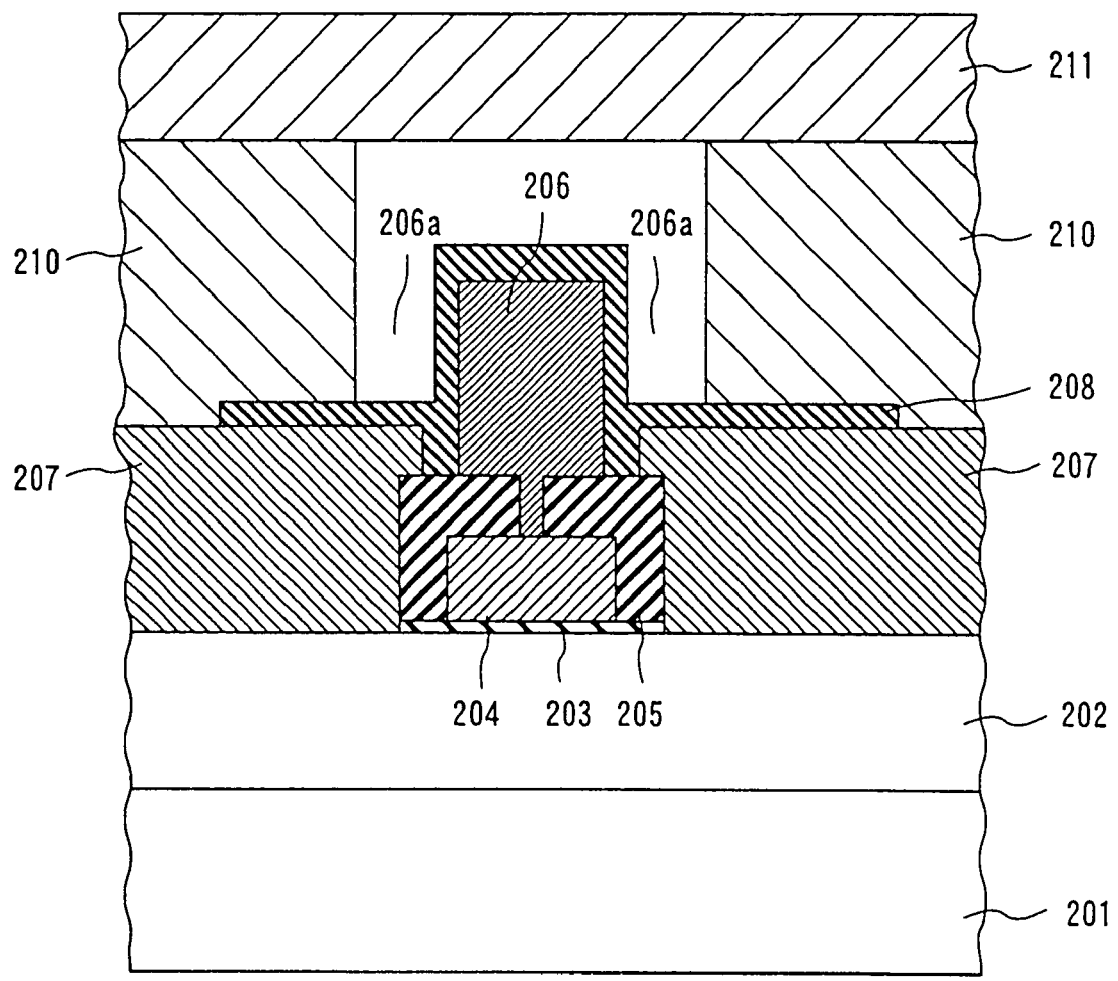
FIG. 7 is a fragmentary sectional view showing one step of the process of manufacturing the semiconductor device according to the first embodiment.

Then, as shown in FIG. 7, a strap 211 is directly connected onto the second source electrode 210. The connection is made by ultrasonic bonding. The strap 211 is formed of Al, for example.

Figure 8:
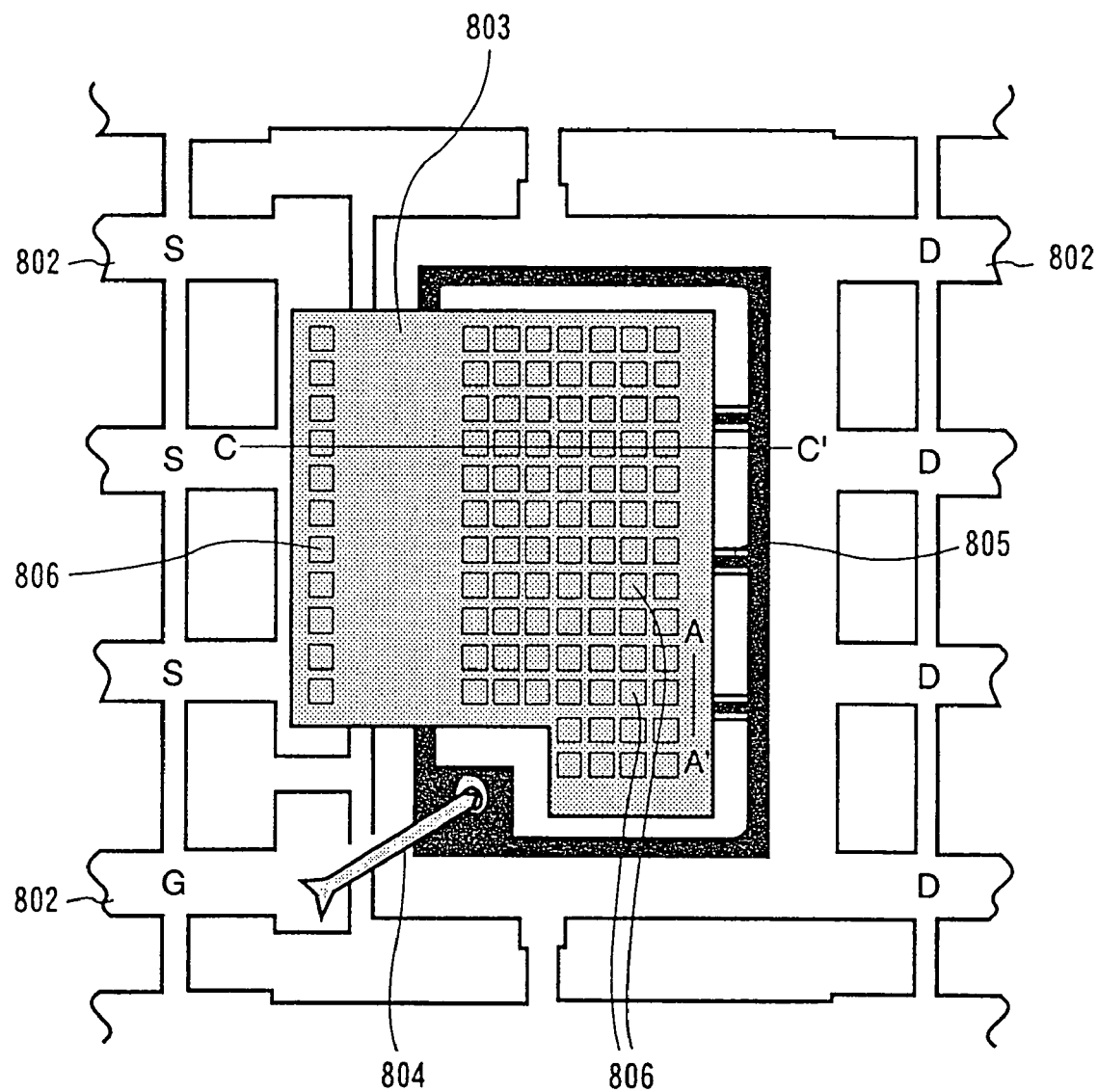
FIG. 8 is a plan view of the semiconductor device according to the first embodiment.
Figure 9:
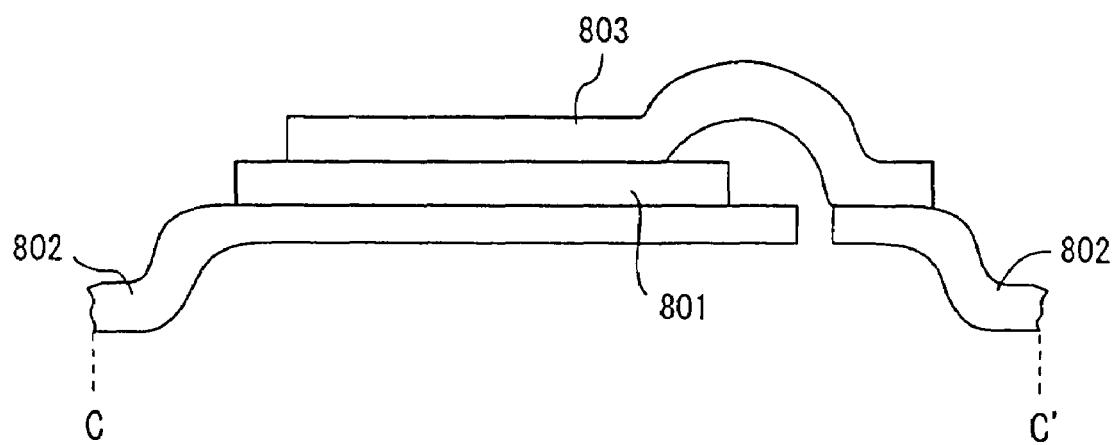
FIG. 9 is a fragmentary sectional view taken along the line C-C' of each of semiconductor devices in FIG. 8 and FIG. 16 according to the first embodiment and a third embodiment.

FIG. 8 shows a plan view of the semiconductor device of this embodiment. Here 802 denotes a lead frame, 803 denotes a strap, 804 denotes a gate wire, and 805 denotes a gate wiring. 806 denotes an application region of ultrasonic waves. FIG. 9 is a fragmentary sectional view showing an outline of a section taken along the line C-C' in FIG. 8. In FIG. 9, 801 denotes a semiconductor substrate.

Since the upper surface of the source electrode is formed higher than the upper surface of the gate wiring as described above, it becomes possible to reduce shock applied to the insulating film formed on the gate wiring when the strap is connected to the source electrode by ultrasonic bonding. Namely, the following situation can be prevented: the gate wiring is crushed and deformed to the source electrode side to thereby cause a short-circuit between the gate wiring and the source electrode; or the insulating film formed on the gate wiring deteriorates to thereby cause a short-circuit between the strap and the gate wiring, and as a result, it becomes possible to eliminate a short-circuit fault without incurring an increase in internal resistance.

Although the aforementioned second source electrode is formed thicker than the first source electrode on the N-type source region, but it is not limited to this particular example. When the strap is connected onto the second source electrode, more force is applied to the electrode which is formed thicker as a cushioning material to absorb shock. If the first source electrode is formed thicker, the first source electrode functions as a cushioning material when the strap is connected onto the second source electrode. Accordingly, force is applied onto the first source electrode and also to the insulating film on the side wall of the gate wiring, which causes the deterioration of the insulating film. Hence, it is preferable to form the second source electrode thicker since more shock is absorbed by the second source electrode so that the possibility of deterioration of the second insulating film due to shock when the strap is connected is low.

Moreover, since the second source electrode is formed apart from the gate wiring with a gap therebetween, a short-circuit fault, which is caused because shock is particularly applied to an end portion of the second source electrode when the strap is connected to the upper portion thereof and thereby the second source electrode is deformed, can be prevented.

Furthermore, the second insulating film needs to be formed so as to cover the gate wiring, but by forming the insulating film to extend onto part of the upper surface of the first source electrode so that an end portion of the first source electrode is covered with the insulating film, a fault caused by misalignment in patterning can be prevented, and in addition, a short-circuit fault caused by deformation when shock is applied to the end portion of the first source electrode when the strap is connected to the upper portion can be prevented.

In this embodiment, the semiconductor device with an offset mesh trench structure in which a trench is formed in a mesh pattern is described, but without being limited to this, a semiconductor device with a stripe trench structure in which a trench is formed in a striped pattern is also possible.

Second Embodiment

Figure 10:
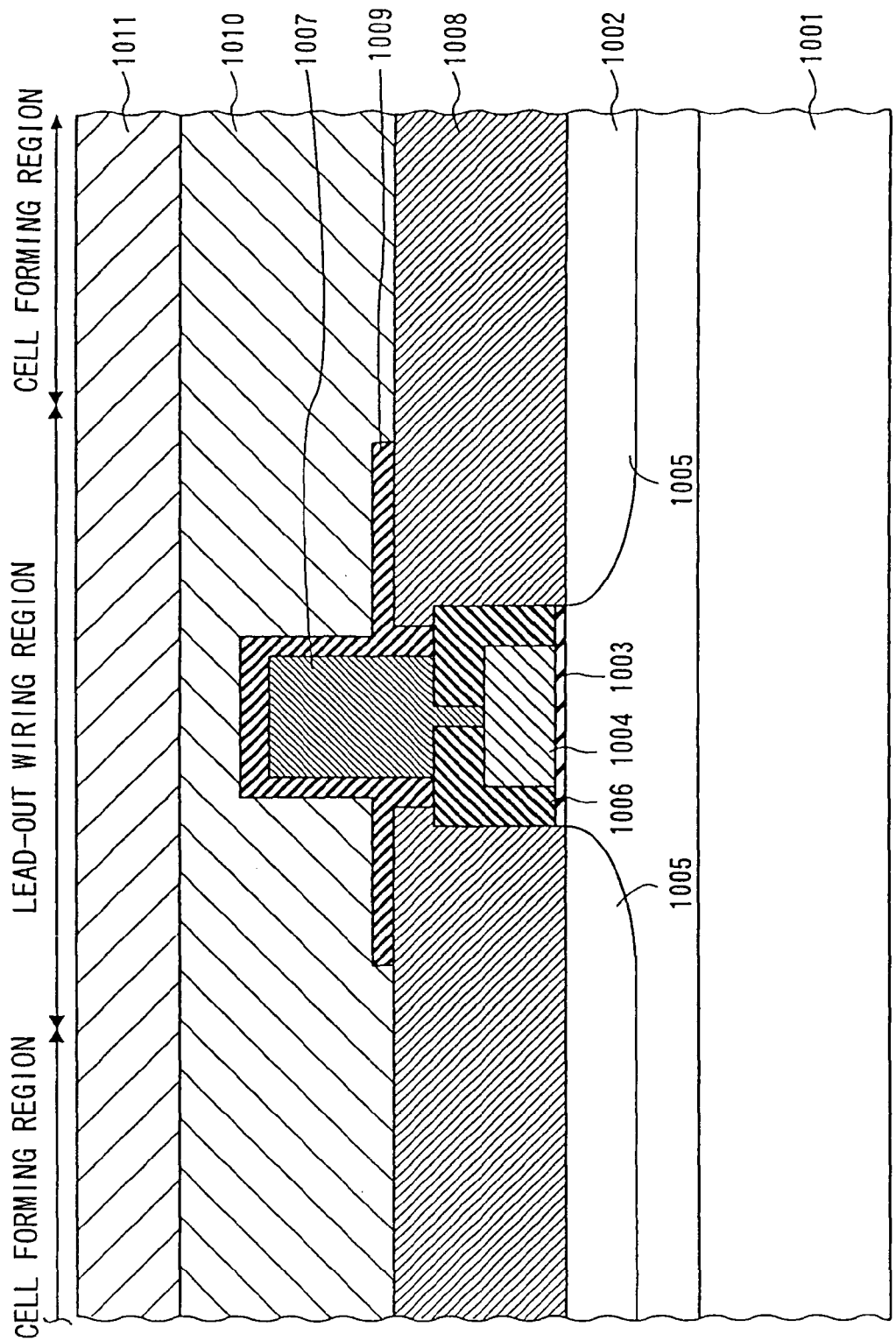
FIG. 10 is a fragmentary sectional view of a semiconductor device according to a second embodiment.

Next, a semiconductor device of the second embodiment will be explained referring to FIG. 10.

In this embodiment, the explanation is given with an MOSFET and an IGBT as its examples. FIG. 10 is a fragmentary sectional view of a semiconductor device. As shown in FIG. 10, a first insulating film 1003 is formed, for example, on a P-type base region 1002 of a lead-out wiring region formed on an N-type semiconductor substrate 1001. A first gate wiring 1004 is formed on the first insulating film 1003.

A trench (not shown) is formed perpendicular to the first gate wiring 1004 in the P-type base region 1002 of a cell forming region. The trench has a stripe trench structure. An N-type source region 1005 is selectively formed on the surface of the P-type base region 1002 around the trench. Incidentally, FIG. 10 is a fragmentary sectional view on the N-type source region 1005. The structure of the cell forming region not shown is the same as that in the aforementioned first embodiment, and hence the explanation thereof is omitted.

The first gate wiring 1004 is formed of a conductive material such as polysilicon and electrically connected to trench gate electrodes of the cell forming regions in other regions (not shown), respectively. A first interlayer dielectric 1006 such as an UDO or a BPSG is formed on a side surface and part of an upper surface of the first gate wiring 1004. A second gate wiring 1007 made of a conductive material such as Al is formed on the first gate wiring 1004 on which the first interlayer dielectric 1006 is not formed, and used as a lead-out wiring for the first gate wiring 1004. The first interlayer dielectric may be integrally formed by an insulating film made of the same material.

A first source electrode 1008 such as Al is formed on the N-type source region 1005, and the first source electrode 1008 is formed to be insulated from the first gate wiring 1004 by the first interlayer dielectric 1006.

On part of an upper surface of the first source electrode 1008 and a side surface and an upper surface of the second gate wiring 1007, a second insulating film 1009 is formed to prevent a short-circuit between the second gate wiring 1007 and a strap and a short-circuit between the first source electrode 1008 and the second gate wiring 1007 when the strap is connected by ultrasonic bonding.

Although the second insulating film 1009 is formed on part of the upper surface of the first source electrode 1008, it may not be formed thereon. By forming the insulating film to extend onto part of the upper surface of the first source electrode 1008 as described above, a short circuit fault caused by misalignment in patterning can be prevented, whereby a device with high yield and high reliability can be manufactured. The second insulating film 1009 is composed of a silicon oxide film, a silicon nitride film, or a stacked film thereof. It is desirable to use an insulating film with a certain degree of hardness as the second insulating film 1009 since an electrode layer is formed thereon. The thickness of the second insulating film 1009 is preferably 2 µm to 4 µm.

A second source electrode 1010 such as Al is formed on the first source electrode 1008 and the second insulating film 1009. The second source electrode 1010 is formed thicker than the first source electrode 1008 on the N-type source region 1005.

Deterioration such as deformation in an interface between different kinds of materials and an increase in resistance can be prevented by forming the first source electrode 1008 and the second source electrode 1010 with the same conductive material.

The second source electrode 1010 is formed also on the second insulating film 1009 formed on the gate wiring 1007. A strap 1011 which connects with the second source electrode 1010 is formed on the second source electrode 1010. The strap 1011 is a connecting plate, for example, made of Al. The strap 1011 is connected, for example, to a lead frame (not shown) for connection to the outside.

As described above, no gap is provided in the second source electrode in this embodiment. Accordingly, it becomes possible to reduce shock applied to the insulating film formed on the gate wiring when the strap is connected to the source electrode by ultrasonic bonding without the addition of steps. Namely, a short-circuit between the gate wiring and the source electrode due to the deformation of the gate wiring can be prevented, whereby it becomes possible to eliminate a short-circuit fault without incurring an increase in internal resistance. Moreover, by forming the area of contact between the source electrode and the strap larger, a reduction in resistance becomes possible.

Although the aforementioned second source electrode is formed thicker than the first source electrode on the N-type source region, but the present invention is not limited to this particular example. When the strap is connected onto the second source electrode, more force is applied to the electrode which is formed thicker as a cushioning material to absorb shock. If the first source electrode is formed thicker, the first source electrode functions as a cushioning material when the strap is connected onto the second source electrode. Accordingly, force is applied onto the first source electrode and also to the insulating film on the side wall of the gate wiring, which causes the deterioration of the insulating film. Hence, it is preferable to form the second source electrode thicker since more shock is absorbed by the second source electrode so that the possibility of deterioration of the second insulating film due to shock when the strap is connected is low.

Furthermore, the second insulating film needs to be formed so as to cover the gate wiring, but by forming the insulating film to extend onto part of the upper surface of the first source electrode so that an end portion of the first source electrode is covered with the insulating film, a fault caused by misalignment in patterning can be prevented, and in addition, a short-circuit fault caused by deformation when shock is applied to the end portion of the first source electrode when the strap is connected to the upper portion can be prevented.

In this embodiment, the semiconductor device with a stripe trench structure in which a trench is formed in a striped pattern is described, but without being limited to this, a semiconductor device with an offset mesh trench structure in which a trench is formed in a mesh pattern is also possible.

Third Embodiment

A semiconductor device of the third embodiment will be explained referring to FIG. 11 to FIG. 19.

Figure 11:
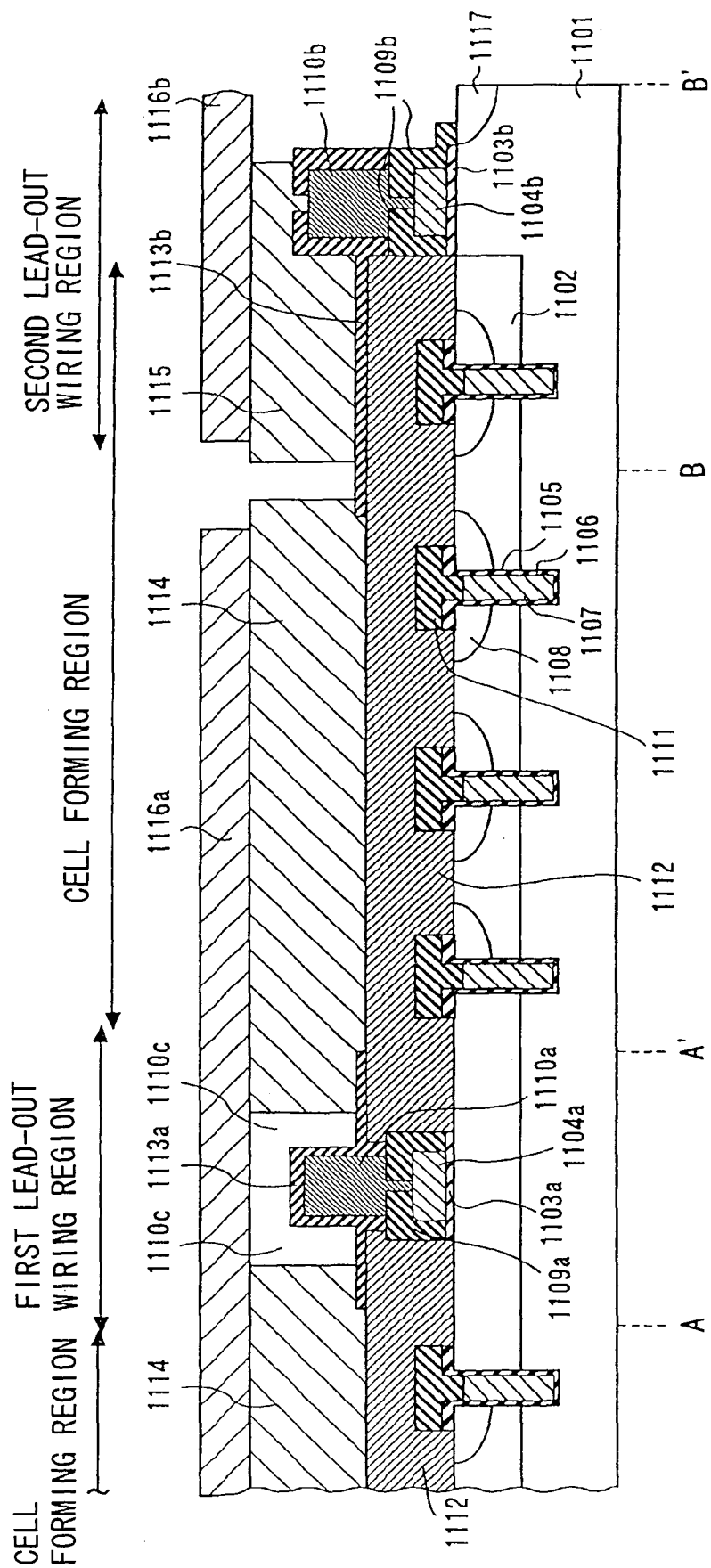
FIG. 11 is a fragmentary sectional view taken along the line A-A'-B-B' of the semiconductor device in FIG. 16 according to the third embodiment.

In this embodiment, the explanation is given with an MOSFET and an IGBT as its examples. FIG. 11 is a sectional view taken along the line A-A'-B-B' in FIG. 16. A first and second lead-out wiring regions and a cell forming region are shown. The first lead-out wiring region is a lead-out wiring region sandwiched between the cell forming regions, and the second lead-out wiring region is a lead-out wiring region formed in at least part of an outer peripheral region of the cell forming region.

As shown in FIG. 11, a P-type base region 1102 is formed, for example, on an N-type semiconductor substrate 1101 of the first lead-out wiring region and the cell forming region. First insulating films 1103a and 1103b are formed on the P-type base region 1102 of the first and second lead-out wiring regions and on the semiconductor substrate 1101. First gate wirings 1104a and 1104b are formed on the first insulating films 1103a and 1103b, respectively.

In the P-type base region 1102 of the cell forming region, a trench 1105 is formed perpendicular and parallel to the first gate wiring 1104a in the first lead-out wiring region. The trench 1105 has an offset mesh trench structure. Incidentally, FIG. 11 is a fragmentary sectional view of a region in which the trench 1105 is formed perpendicular to the first gate wiring 1104a in the first lead-out wiring region. A gate insulating film 1106 is formed in the trench 1105, and a trench gate electrode 1107 is buried in the trench 1105 in such a manner as to touch the gate insulating film 1106. An N-type source region 1108 is formed on the surface of the P-type base region 1102 around the trench 1105 The N-type source region 1108 is not formed around the trench 1105 on the first lead-out wiring region side.

A cell formed in the cell forming region functions as a MOSFET if an N$^+$-type drain region is formed under the semiconductor substrate 1101 and a drain electrode is formed so as to touch the N$^+$-type drain region, and functions as an IGBT (Insulated Gate Bipolar Transistor) if a P$^+$-type collector region is formed under the semiconductor substrate 1101 and a collector electrode is formed so as to touch the P$^+$-type collector region. The cell formed in the cell forming region is not limited to the above. The structure of the cell is not limited to a trench type, and may be a planer type.

The first gate wirings 1104a and 1104b and the trench gate electrode 1107 are formed of a conductive material such as polysilicon and electrically connected to each other in another region (not shown).

First interlayer dielectrics 1109a and 1109b such as a UDO (Undoped Oxide) or a BPSG are formed on side surfaces and part of each of upper surfaces of the first gate wirings 1004a and 1104b of the first and second lead-out wiring regions, respectively. The first insulating films and the first interlayer dielectrics may be formed integrally by an insulating film made of the same material. On the first gate wirings 1104a and 1104b on which the first interlayer dielectrics 1109a and 1109b are not formed, second gate wirings 1110a and 1110b made of a conductive material such as Al are formed and used as lead-out wirings. A second interlayer dielectric 1111 is formed on the trench electrode 1107. The second interlayer dielectric 1111 may be completely buried in the trench 1105.

A first source electrode 1112 such as Al is formed on the P-type base region 1102 and the N-type source region 1108 of the cell forming region. The first source electrode 1112 is formed so as to have a large area, which leads to a reduction in resistance. The first source electrode 1112 is formed to be insulated from the first gate wirings 1104a and 1104b and the trench gate electrode 1107 by the first interlayer dielectrics 1109a and 1109b and the second interlayer dielectric 1111. Second insulating films 1113a and 1113b whose ends are formed on part of an upper surface of the first source electrode 1112 are formed on side surfaces and upper surfaces of the second gate wirings 1110a and 1110b, respectively. The second insulating film 1113a formed in the first lead-out wiring region is formed in order to, when an almost platy connecting plate (here called a strap) is connected to the upper portion thereof by ultrasonic bonding, prevent a short-circuit between the second gate wiring 1110a and the strap and a short-circuit between the first source electrode 1112 and the second gate wiring 1110a.

Although the second insulating films 1113a and 1113b are formed on part of the upper surface of the first source electrode 1112, they may not be formed thereon. However, by forming the insulating films to extend onto part of the upper surface of the first source electrode 1112 as described above, a short circuit fault caused by misalignment in patterning can be prevented, whereby a device with high yield and high reliability can be manufactured. The second insulating films 1113a and 1113b are composed of a silicon oxide film, a silicon nitride film, or a stacked film thereof. It is desirable to use an insulating film with a certain degree of hardness as the second insulating films 1113a and 1113b since an electrode layer is formed thereon. The thickness of the second insulating films 1113a and 1113b is preferably 2 μm to 4 μm.

A second source electrode 1114 such as Al is formed on the first source electrode 1112 in the cell forming region and on part of each of the second insulating films 1113a and 1113b which are formed on the first source electrode 112. An upper surface of the second source electrode 1114 is formed higher than upper surfaces of the second gate wirings 1110a and 1110b. The second gate wiring 1110a and the second source electrode 1114 in the first lead-out wiring region are arranged with a gap 1110c between them. The second source electrode 1114 is formed thicker than the first source electrode 1112 on the N-type source region 1108. Moreover, a gate electrode 1115 such as Al is formed on the second gate wiring 1110b in the second lead-out wiring region and on the second insulating film 1113b formed on the first source electrode 1112. The second source electrode and the gate electrode 1115 are formed apart from each other.

Deterioration such as deformation in an interface between different kinds of materials and an increase in resistance can be prevented by forming the first source electrode 1112 and the second source electrode 1114 with the same conductive material.

A strap 1116a which connects with the second source electrode 1114 is formed on the second source electrode 1114. The strap 1116a is a connecting plate, for example, made of Al. The strap 1116a is connected to a lead frame (not shown), for example, for connection to the outside. A strap 1116b which connects with the gate electrode 1115 is formed on the gate electrode 1115. The strap 1116b is connected to the lead frame (not shown), for example, for connection to the outside. In a surface region of an outer peripheral edge of the second lead-out wiring region, an N-type stopper region 1117 is formed to prevent the extension of a depletion layer when a reverse bias is applied.

The example in which the strap 1116*b* as the connecting plate is connected to the gate electrode 1115 is described here, but, without being limited to this example, as shown in the first embodiment, connection by a gate wire is also possible.

Next, a method of manufacturing the first and second lead-out wiring regions including gate wirings of the semiconductor device shown in FIG. 11 which is described in this embodiment will be explained by FIG. 12 to FIG. 15. The cell forming region, part of which is omitted, will be described.

Figure 12:
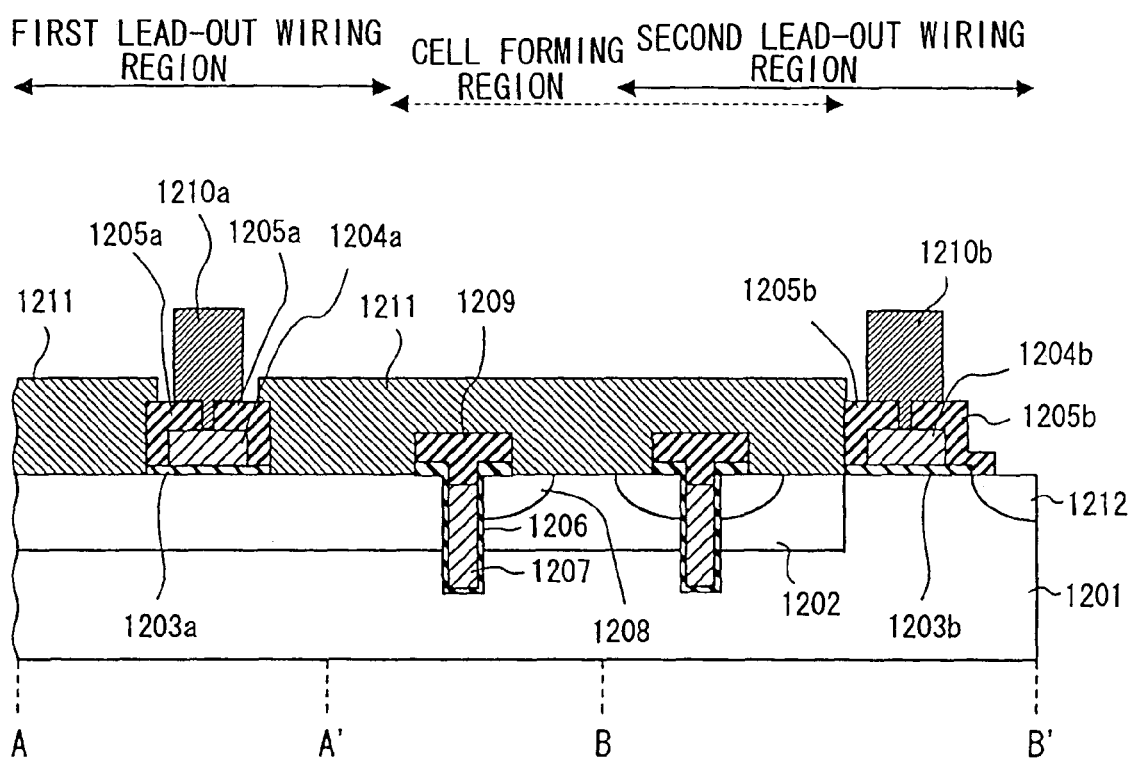
FIG. 12 is a fragmentary sectional view showing one step of the process of manufacturing the semiconductor device according to the third embodiment.

As shown in FIG. 12, a P-type base region 1202 is formed on a semiconductor substrate 1201 in the first lead-out wiring region. Subsequently, first insulating films 1203*a* and 1203*b* are formed on the P-type base region 1202 in the first and second lead-out wiring regions and on the semiconductor substrate 1201. Polysilicon is deposited on the first insulating films 1203*a* and 1203*b* and etched to form first gate wirings 1204*a* and 1204*b* on part of each of the first insulating films 1203*a* and 1203*b* in the first and second lead-out wiring regions. Silicon nitride films are formed on upper surfaces and side surfaces of the first gate wirings 1204*a* and 1204*b* and etched to form slot portions such that part of each of the upper surfaces of the first gate wirings 1204*a* and 1204*b* is exposed, and thus interlayer dielectrics 1205*a* and 1205*b* are formed.

In the cell forming region, a cell at least composed of a gate insulating film 1206, a trench gate electrode 1207, an N-type source region 1208, and a second interlayer dielectric 1209 is formed. Then, Al is deposited and etched to form second gate wirings 1210*a* and 1210*b* in the first and second lead-out wiring regions, respectively, and a first source electrode 1211 is formed in the cell forming region. An N-type stopper region 1212 is formed in a surface region of an outer peripheral edge of the second lead-out wiring region.

Figure 13:
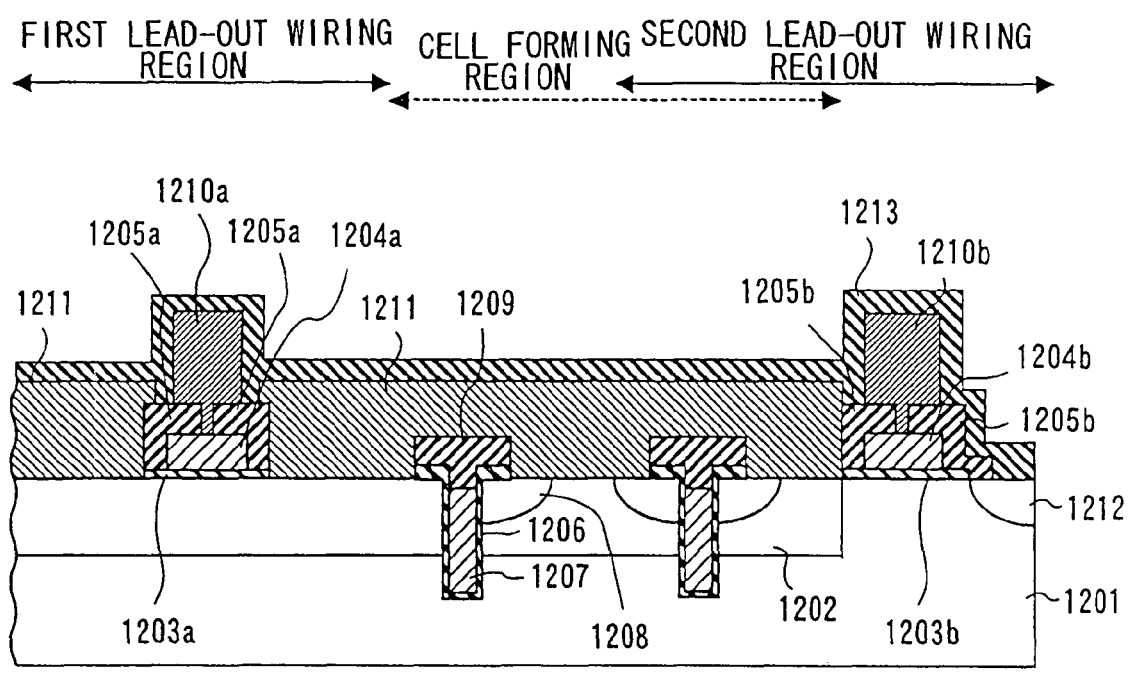
FIG. 13 is a fragmentary sectional view showing one step of the process of manufacturing the semiconductor device according to the third embodiment.

Thereafter, as shown in FIG. 13, a second insulating film 1213 such as a silicon oxide film or a silicon nitride film is deposited in the first and second lead-out wiring regions.

Figure 14:
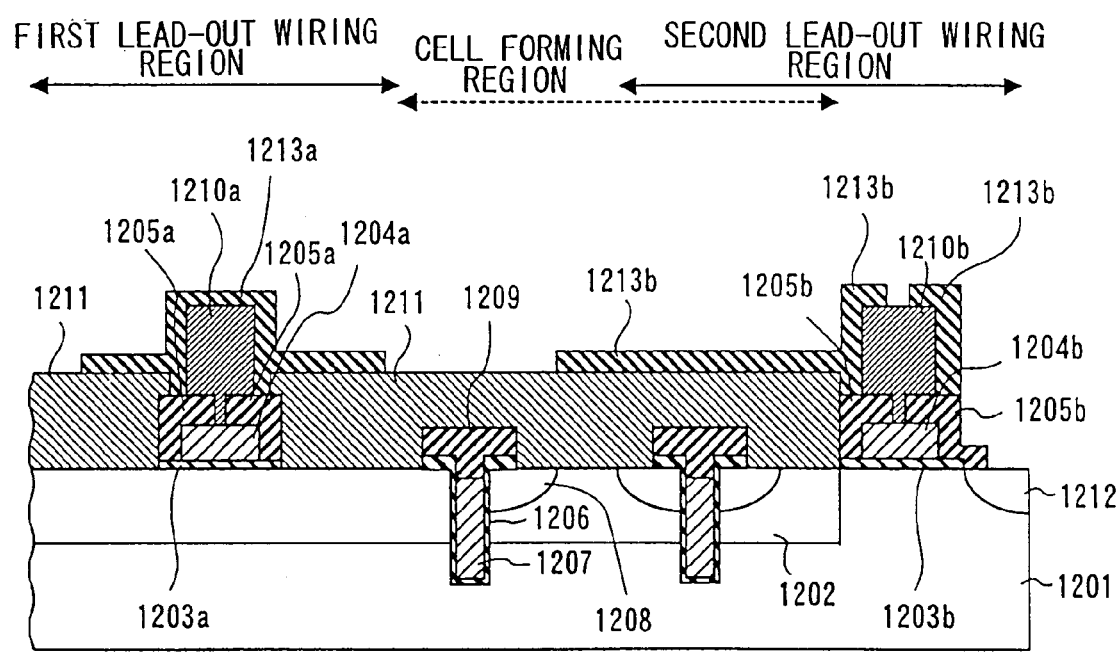
FIG. 14 is a fragmentary sectional view showing one step of the process of manufacturing the semiconductor device according to the third embodiment.

Then, as shown in FIG. 14, by applying a resist film and forming a resist pattern, a second insulating film 1213*a* such as covers the second gate wiring 1210*a* and a second insulating film 1213*b* such that part of an upper surface of the second gate wiring 1210*b* is exposed are formed. The resist pattern is removed by ashing. End portions of the second insulating films 1213*a* and 1213*b* are formed to extend onto the first source electrode 1211.

Figure 15:
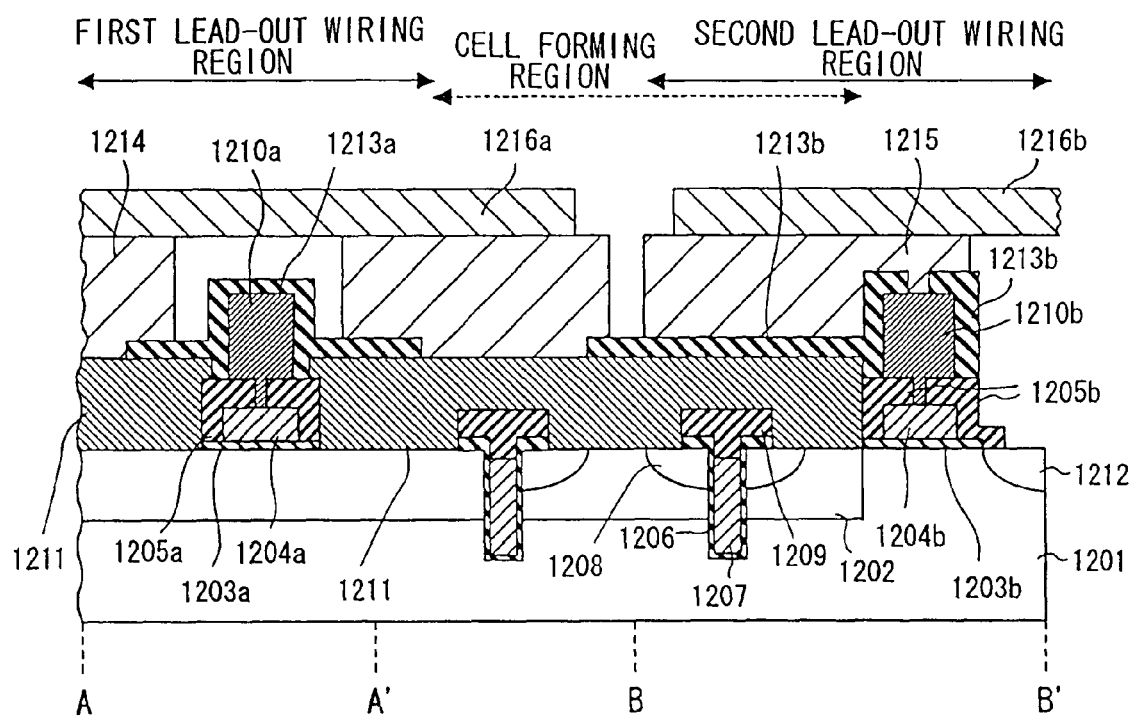
FIG. 15 is a fragmentary sectional view showing one step of the process of manufacturing the semiconductor device according to the third embodiment.

Next, as shown in FIG. 15, by depositing Al, applying a resist film onto the Al, and forming a resist pattern, a second source electrode 1214 is formed on the first source electrode 1211 and on the insulating films 1213*a* and 1213*b* on the first source electrode 1211. A gate electrode 1215 is formed on the second wiring 1210*b* and the second insulating film 1213*b* formed in the second lead-out wiring region. An end portion of the gate electrode 1215 is formed to extend onto the second insulating film 1213*b* formed on the first source electrode 1211.

The second insulating film 1213*b* is formed so that part of an upper surface of the second gate wiring 1210*b* is exposed, and out of the second insulating film 1213*b*, a portion which is formed on the opposite side of the second insulating film extending onto the first source may be a film with a lower hardness than a silicon nitride film and a silicon oxide film and hence may be formed of polyimide used as a protective film since it is unnecessary to form an electrode thereon. Subsequently, a strap 1216*a* is formed on the cell forming region and the first lead-out wiring region by ultrasonic bonding, while a strap 1216*b* is formed on the gate electrode formed in the second lead-out wiring region by ultrasonic bonding and connected to the lead frame (not shown).

Figure 16:
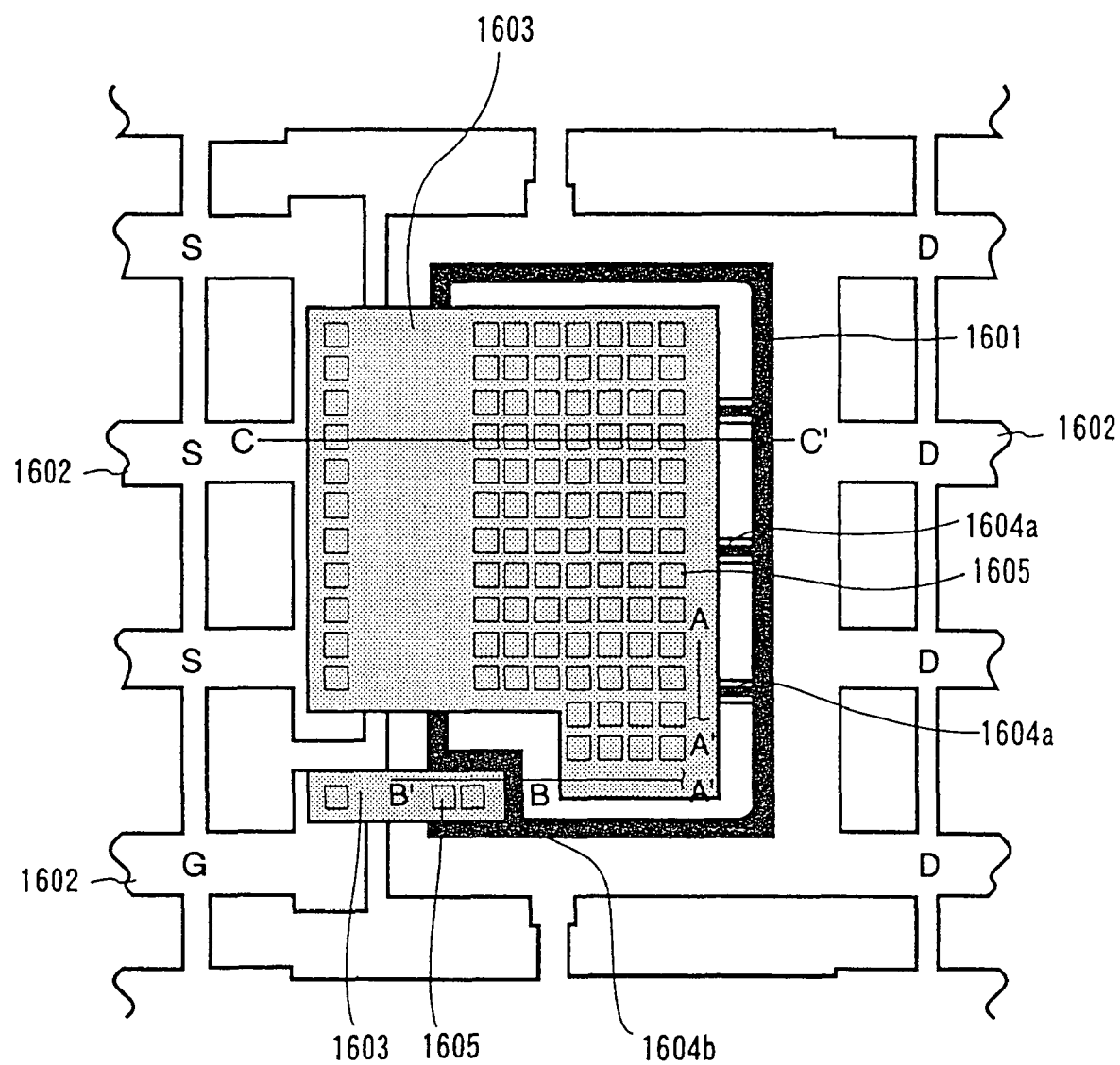
FIG. 16 is a plan view of the semiconductor device according to the third embodiment.

FIG. 16 shows a plan view of the semiconductor device of this embodiment. Here, 1601 denotes a semiconductor substrate, 1602 denotes a lead frame, 1603 denotes a strap, 1604*a* denotes a gate wiring in the first lead-out wiring region, and 1604*b* denotes a gate wiring in the second lead-out wiring region. 1605 denotes an application region of ultrasonic waves. A fragmentary sectional view showing an outline of a section taken along the line C-C' in FIG. 16 is the same as FIG. 9 shown in the first embodiment.

Since an upper surface of the second source electrode is formed higher than or on about the same level with an upper surface of the insulating film on the gate wiring as described above, it becomes possible to reduce shock applied to the insulating film formed on the gate wiring when the strap is connected to the source electrode by ultrasonic bonding. Namely, the following situation can be prevented: the gate wiring is crushed and deformed to the source electrode side to thereby cause a short-circuit between the gate wiring and the source electrode; or the insulating film formed on the gate wiring deteriorates to thereby cause a short-circuit between the strap and the gate wiring, whereby it becomes possible to eliminate a short-circuit fault without incurring an increase in internal resistance.

Although the aforementioned second source electrode is formed thicker than the first source electrode on the N-type source region, but the present invention is not limited to this particular example. When the strap is connected onto the second source electrode, more force is applied to the electrode which is formed thicker as a cushioning material to absorb shock. If the first source electrode is formed thicker, the first source electrode functions as a cushioning material when the strap is connected onto the second source electrode. Accordingly, force is applied onto the first source electrode and also to the insulating film on the side wall of the gate wiring, which causes the deterioration of the insulating film. Hence, it is preferable to form the second source electrode thicker since more shock is absorbed by the second source electrode so that the possibility of deterioration of the second insulating film due to shock when the strap is connected is low.

Moreover, since the second source electrode is formed apart from the gate wiring with a gap therebetween, a short-circuit fault, which is caused because shock is particularly applied to an end portion of the second source electrode when the strap is connected to the upper portion thereof and thereby the second source electrode is deformed, can be prevented.

Furthermore, although the second insulating film formed in the first lead-out wiring region is formed to extend onto part of the upper surface of the first source electrode, the second insulating film has only to be formed so as to cover the second gate wiring. However, by forming the second insulating film to extend onto part of the upper surface of the first source electrode so that an end portion of the first source electrode is covered with the second insulating film, a fault caused by misalignment in patterning can be prevented, and in addition, a short-circuit fault caused by deformation when shock is applied to the end portion of the first source electrode when the strap is connected to the upper portion can be prevented.

Figure 25:
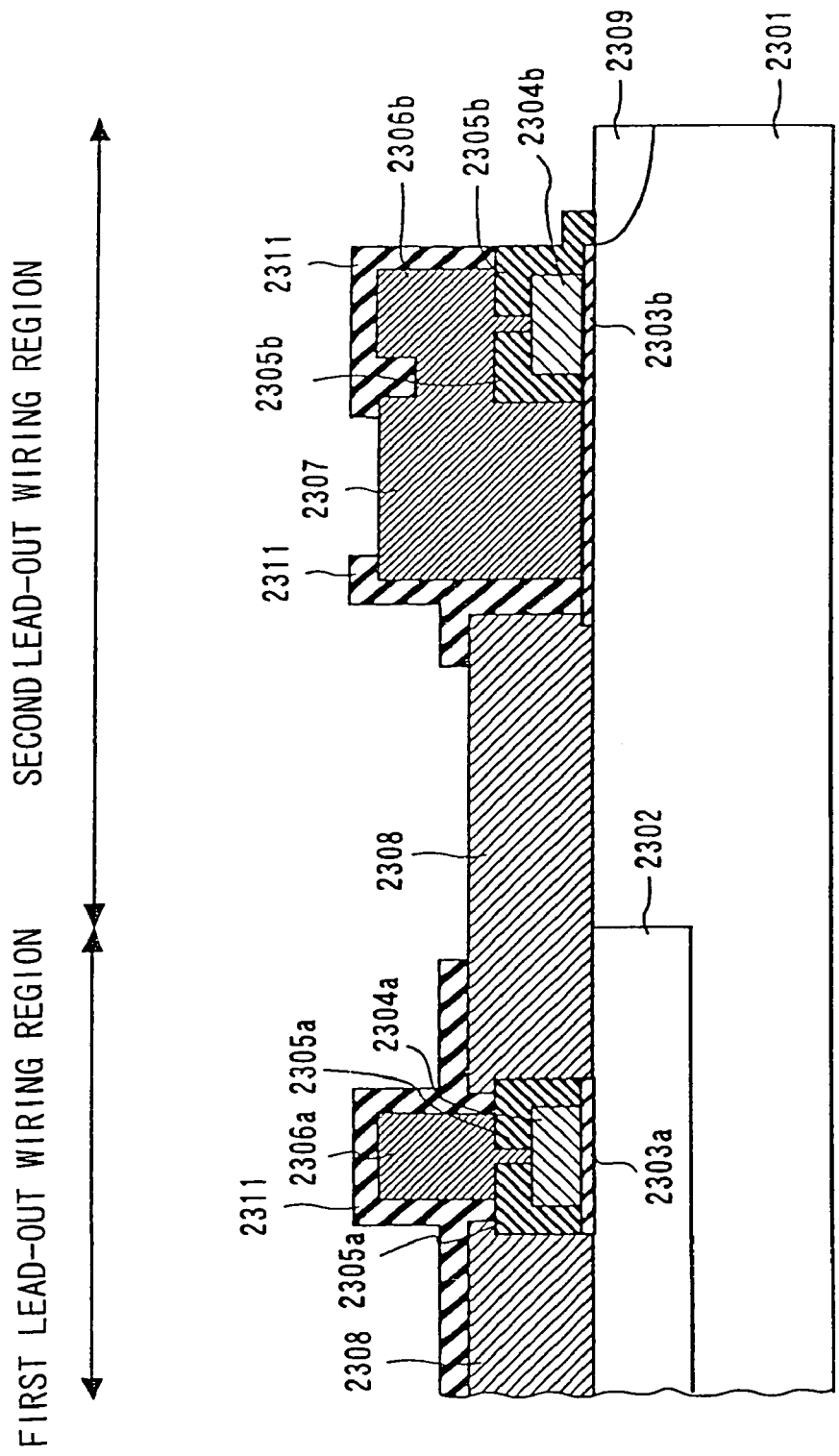
FIG. 25 is a fragmentary sectional view showing one step of the process of manufacturing the related semiconductor device.
Figure 26A:
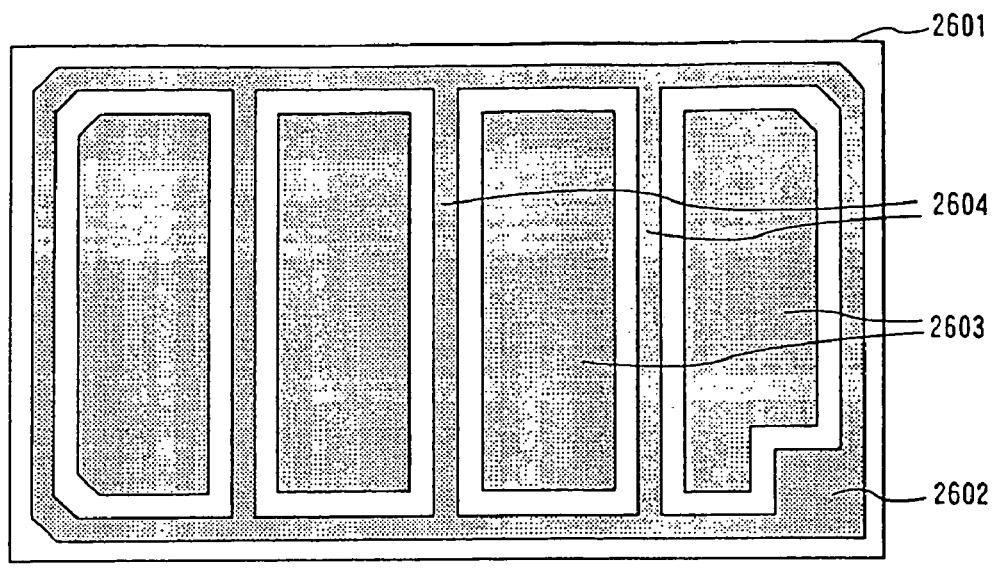
FIG. 26A and FIG. 26B are diagrams showing examples of a layout of the related semiconductor device.
Figure 26B:
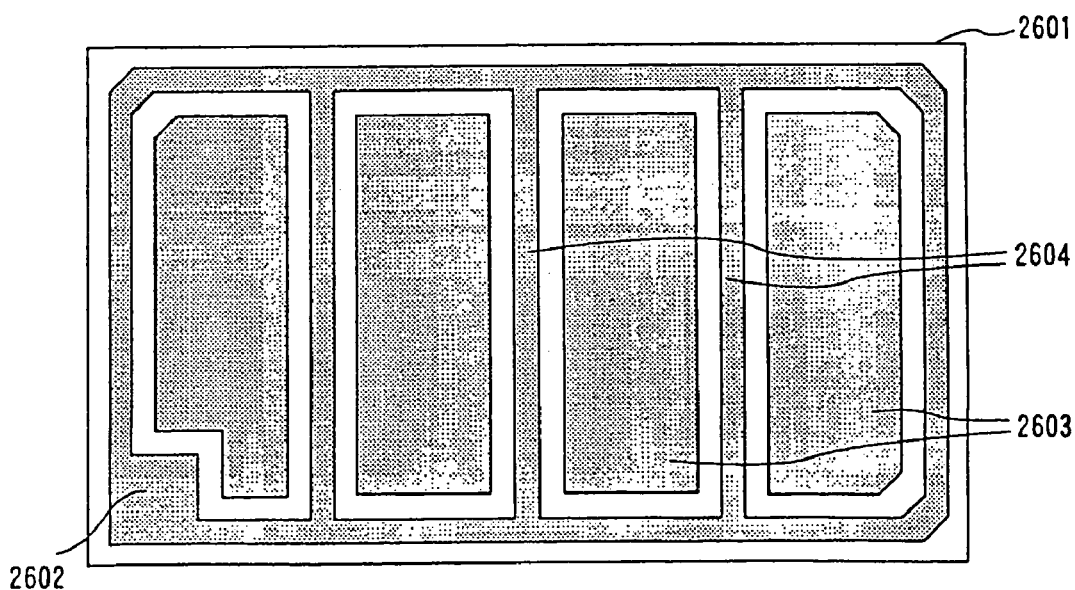

Moreover, in a related art, as shown in FIG. 25, a second lead-out wiring region which is formed in the same process as a first lead-out wiring region is formed side by side with a cell forming region, and no cell such as a MOSFET is formed under the second lead-out wiring region. As shown in FIG. 26A and FIG. 26B, in semiconductor chips corresponding to packages having symmetrical structures, the positions of respective gate electrodes 2602 on respective semiconductor chips 2601 are different even in the packages of the same size, whereby there is a problem that the semiconductor chips 2601 to be mounted need to be designed individually. Here in FIG. 26A and FIG. 26B, 2603 denotes a source electrode, and 2604 denotes a gate wiring.

Besides, there is a problem that when, in order to reduce on-state resistance, the area of the cell forming region of the semiconductor chip is formed wider, the number of cells is increased, and the area of the source electrode is formed more widely, the area, number, position, shape, and so on of gate electrodes are limited. Further, there is a problem that it is necessary to select the area, number, position, shape, and so on of gate electrodes depending on the position of a lead frame.

In this embodiment, in the second lead-out wiring region, the second insulating film is formed between the gate electrode and the first source electrode, and they are insulated. Hence, the cell forming region can be provided under part of the second lead-out wiring region, whereby regardless of the area of the gate electrode, the area of the cell forming region can be formed more widely, resulting in a reduction in on-state resistance. Moreover, regardless of the area of the cell forming region and the position of the lead frame, the area, number, position, shape, and so on of gate electrodes can be selected. Namely, desired area, number, position, shape, and so on of gate electrodes can be selected, and in addition, the area of the cell forming region can be formed more widely, leading to a reduction in on-state resistance.

Figure 17:
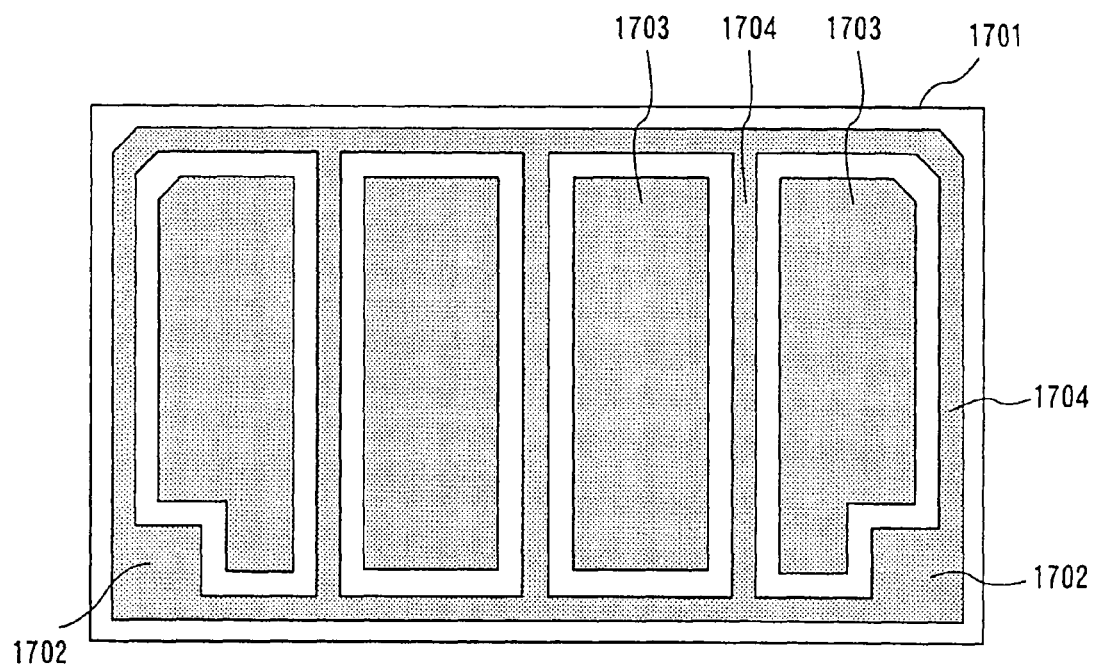
FIG. 17 is a diagram showing a layout of the semiconductor device according to the third embodiment.

Furthermore, concurrently with the formation of the wider cell forming region, the gate electrodes can be formed in two corner portions of the semiconductor chip as shown in FIG. 17, and hence new designing is unnecessary even in semiconductor chips (for example, in FIG. 26A and FIG. 26B) in which the positions of gate electrodes are different corresponding to packages. 1701 denotes a semiconductor chip, 1702 denotes a gate electrode, 1703 denotes a source electrode, and 1704 denotes a gate wiring.

Figure 18A:
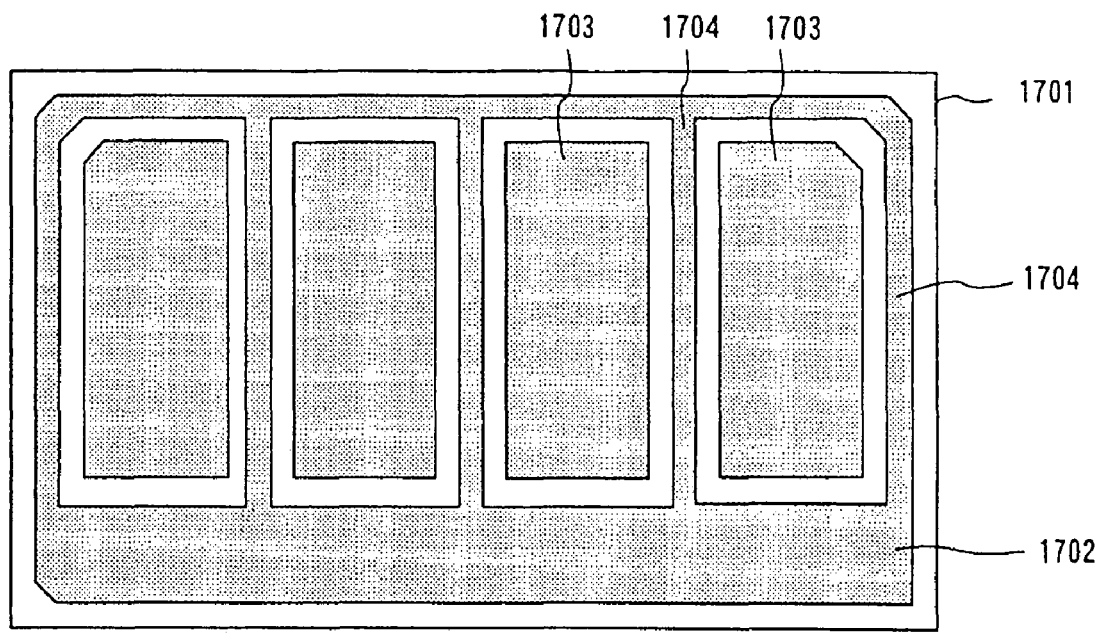
FIG. 18A and FIG. 18B are diagrams showing other layouts of the semiconductor device according to the third embodiment.
Figure 18B:
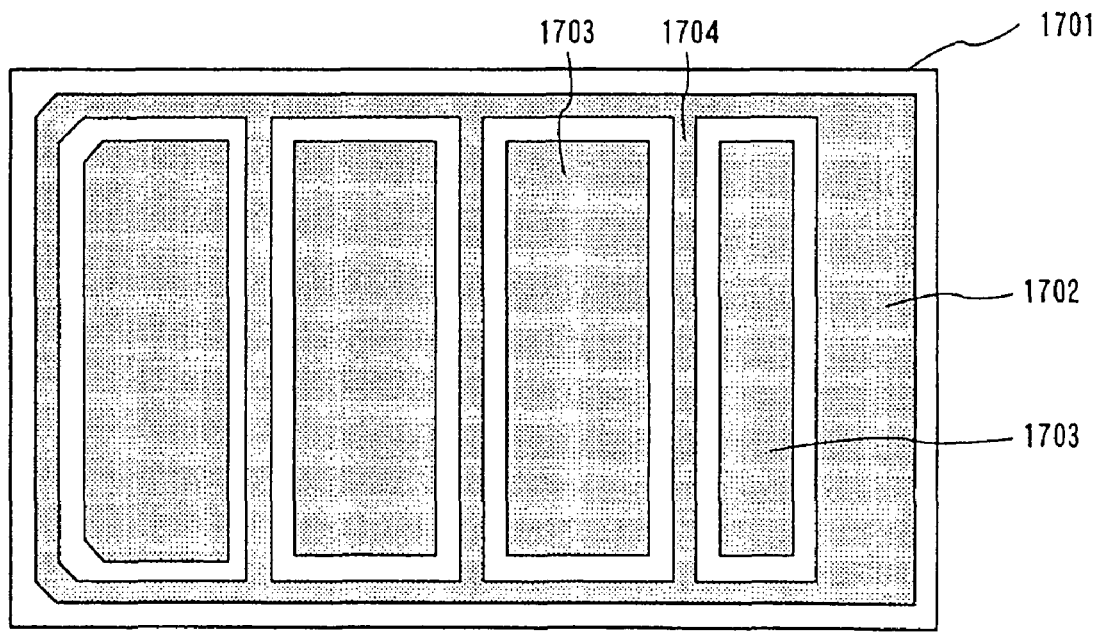

Moreover, by forming the gate electrode in a region parallel to a long side or a short side of the semiconductor chip as shown in FIG. 18A and FIG. 18B, it is possible not only to form the cell forming region widely but also to form the gate electrode optionally widely. Thanks to this formation, the strap structure can be formed more easily, and besides a reduction in resistance becomes possible. Further, since the connection between the gate electrode and the lead frame can be performed at an optional position, the semiconductor device with a high degree of flexibility in position, size, and so on can be formed.

The second insulating film in the first lead-out wiring region and the second insulating film in the second lead-out wiring region can be formed in the same process. Also, the second source electrode in the cell forming region and the gate electrode in the second lead-out wiring region can be formed in the same process.

Figure 19:
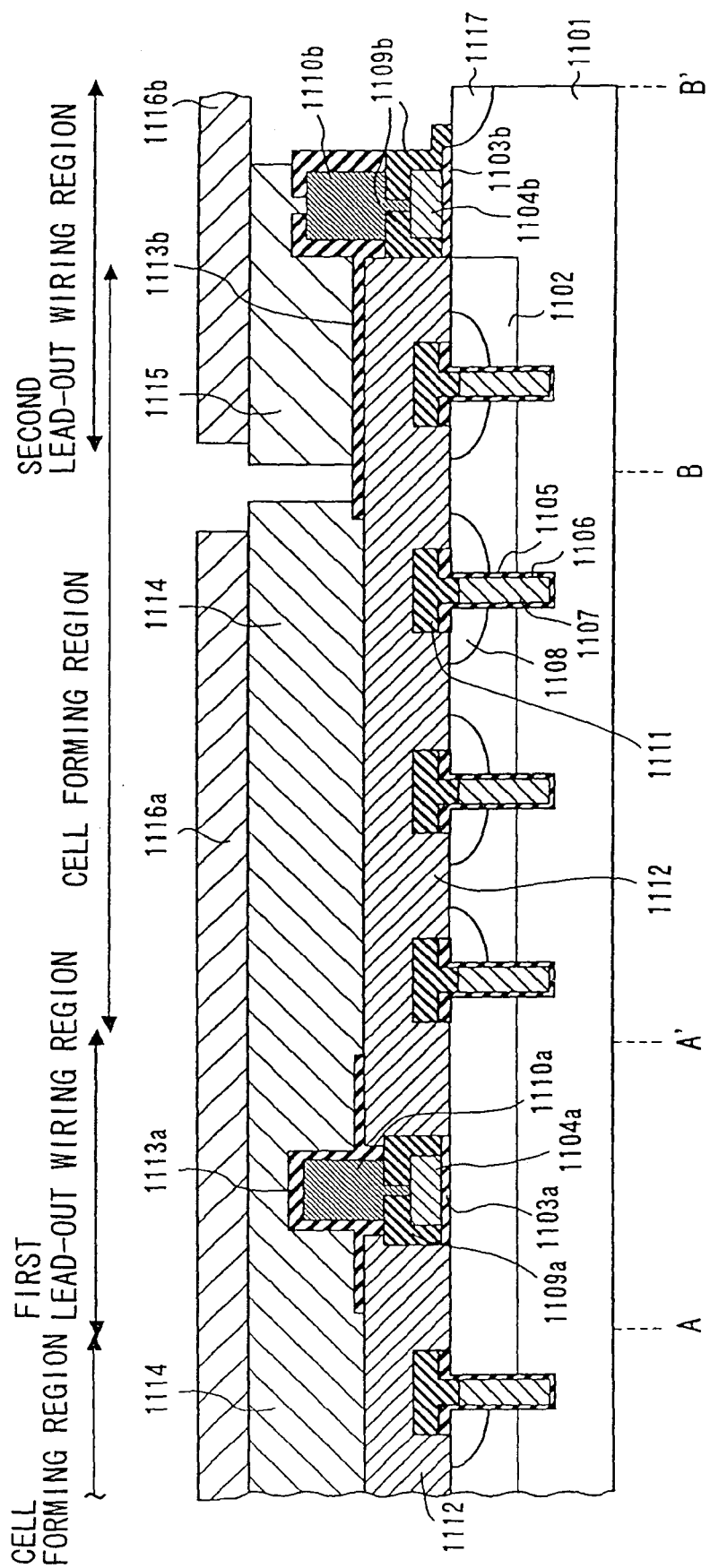
FIG. 19 is a fragmentary sectional view of another semiconductor device according to the third embodiment.
Figure 20:
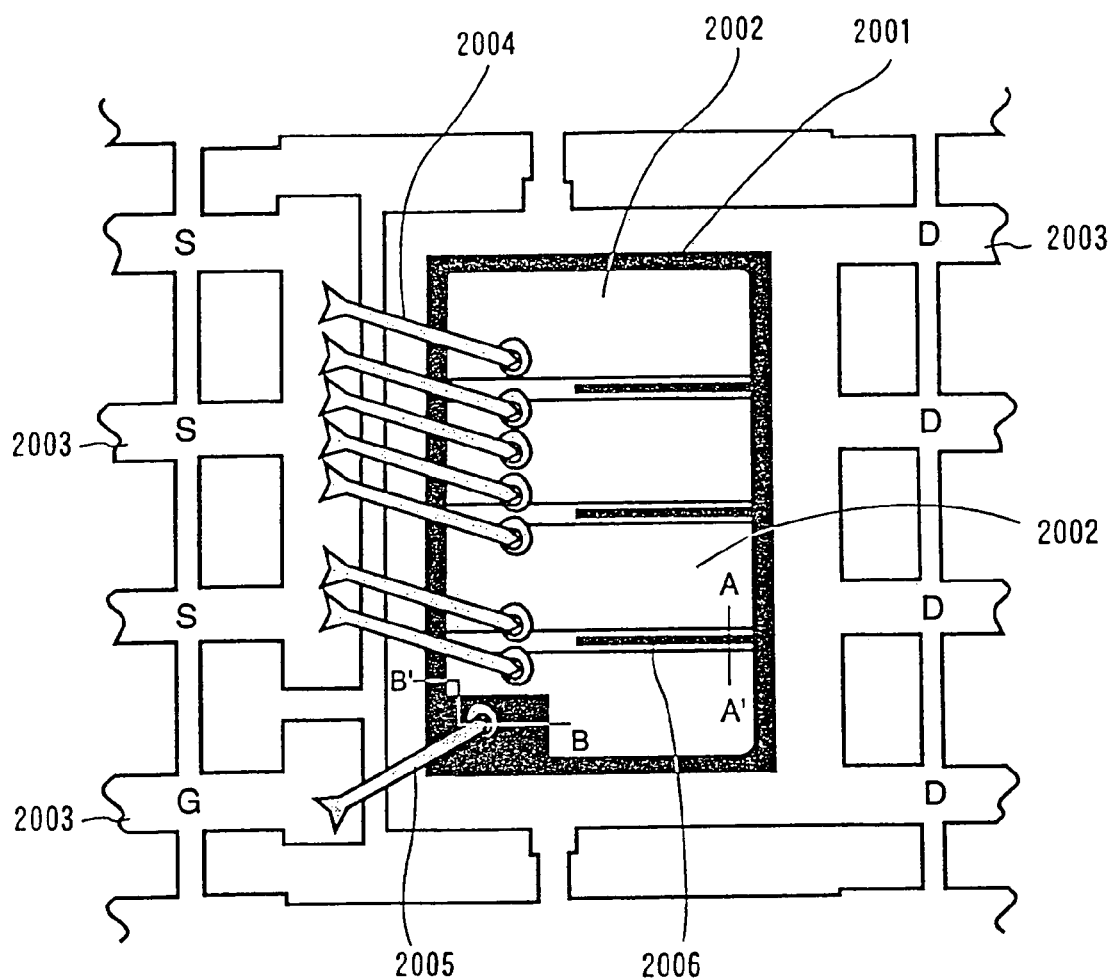
FIG. 20 is a plan view of a related semiconductor device.
Figure 21:
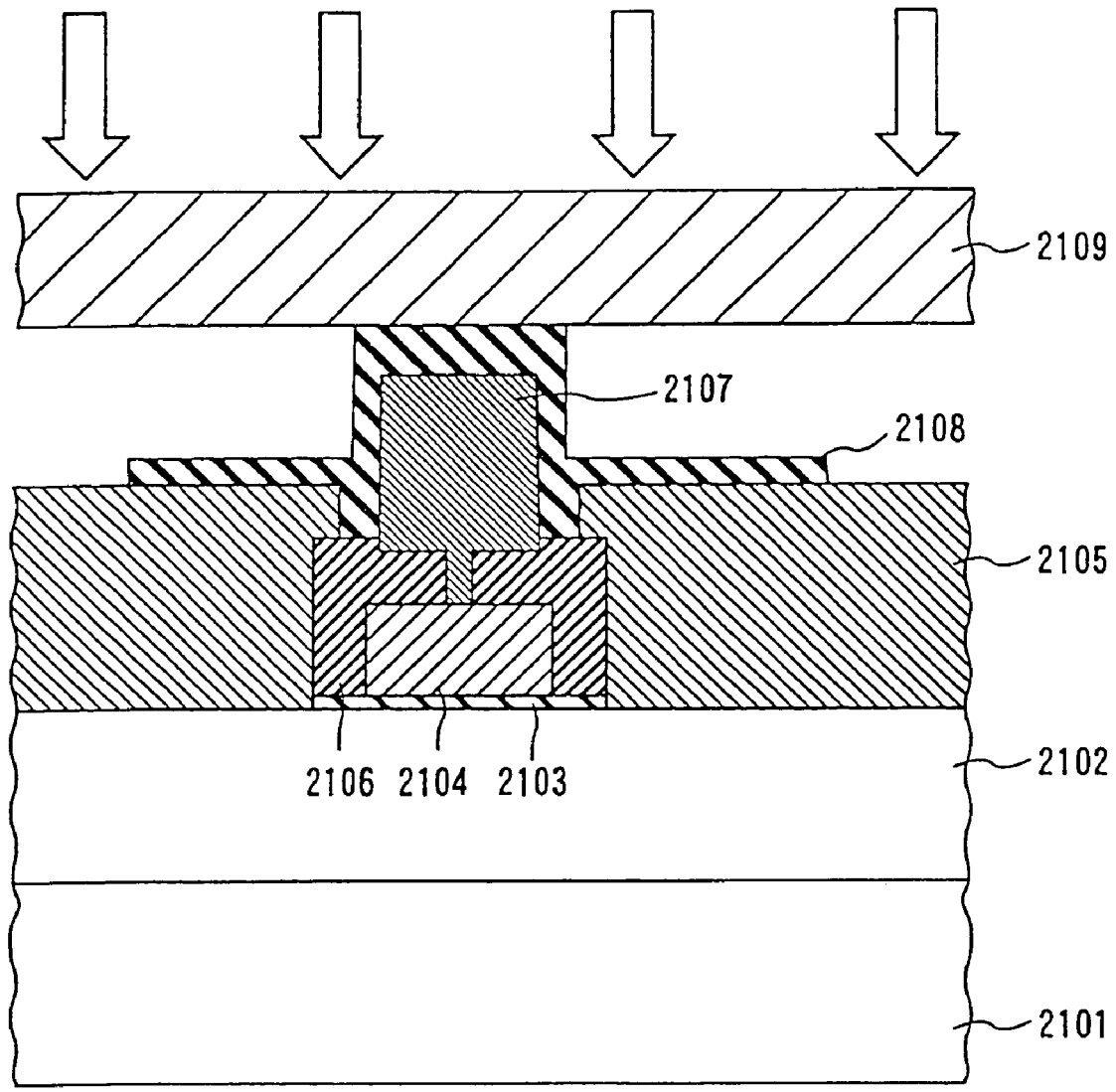
FIG. 21 is a fragmentary sectional view of the related semiconductor device.
Figure 22:
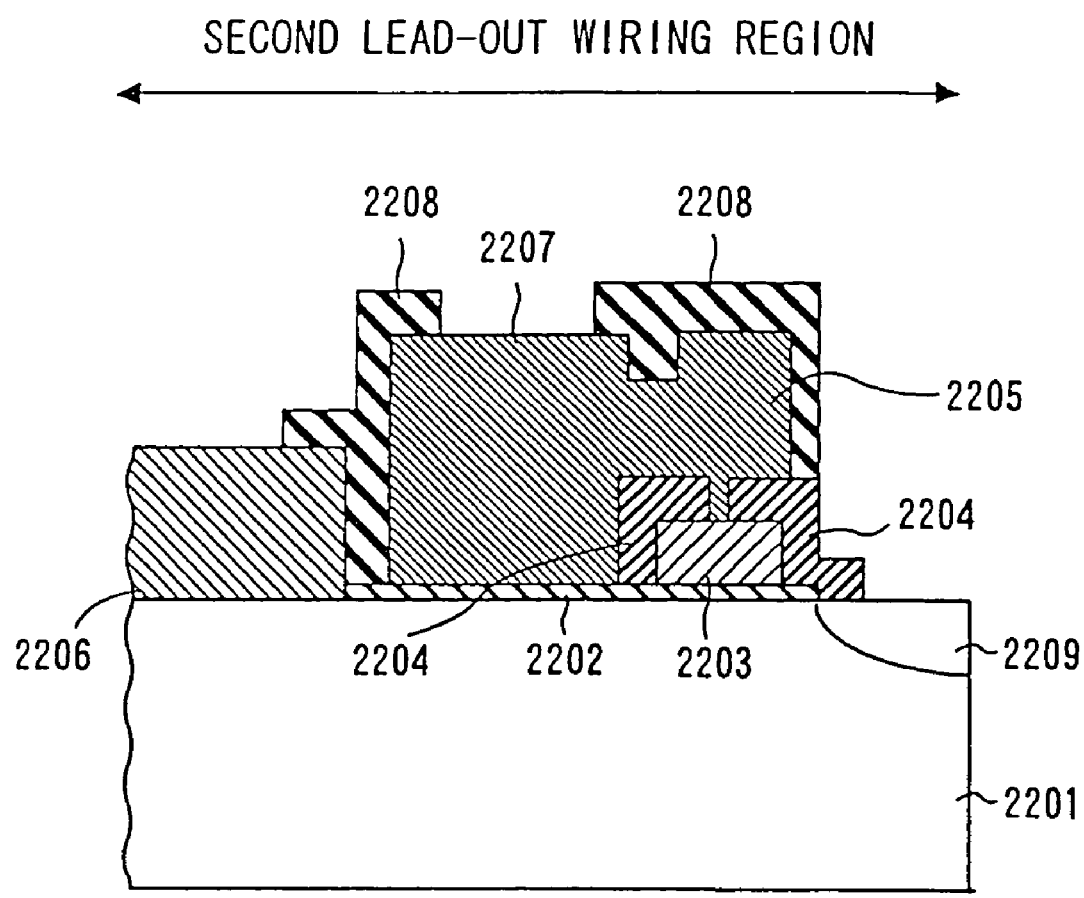
FIG. 22 is another fragmentary sectional view of the related semiconductor device.
Figure 23:
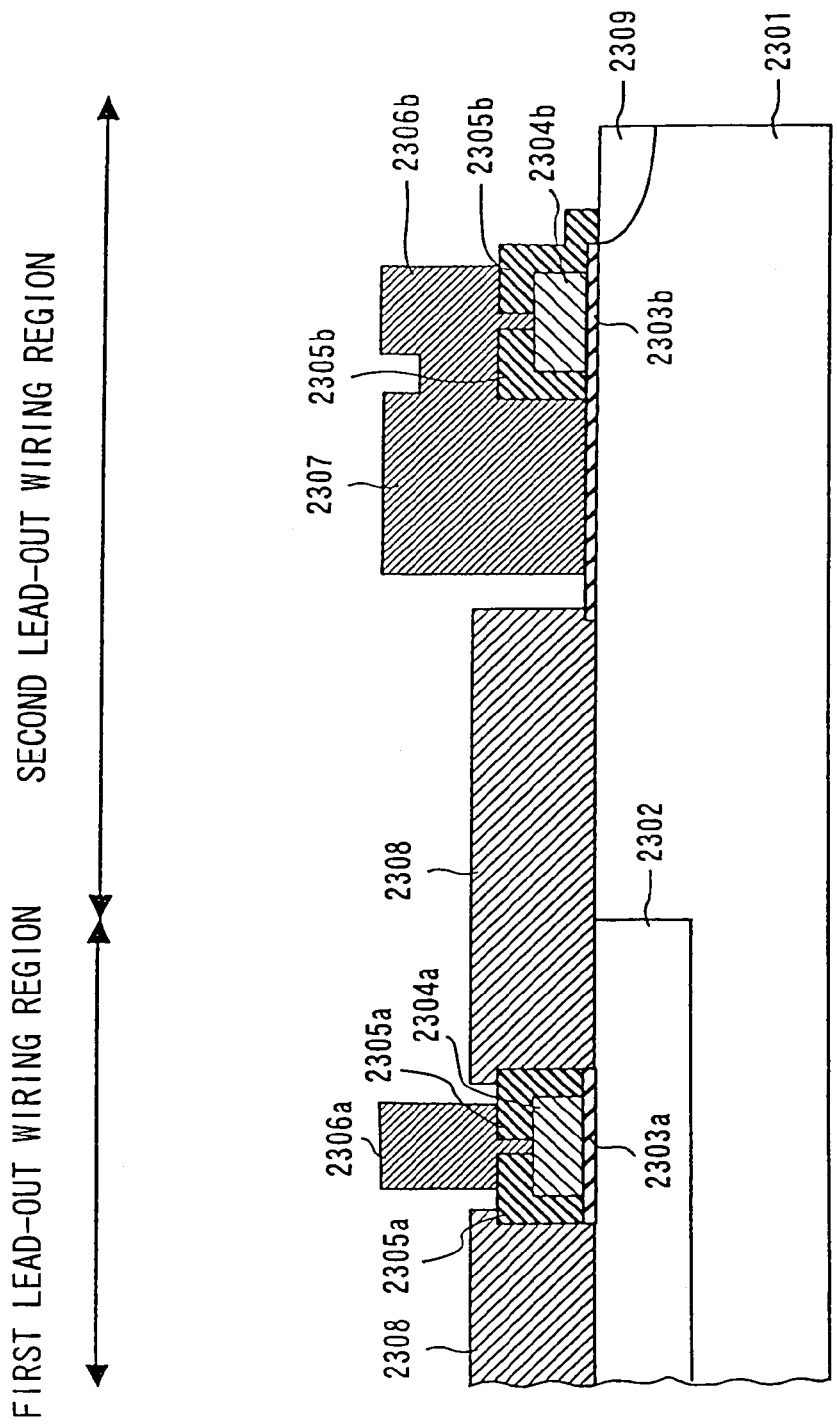
FIG. 23 is a fragmentary sectional view showing one step of the process of manufacturing the related semiconductor device.
Figure 24:
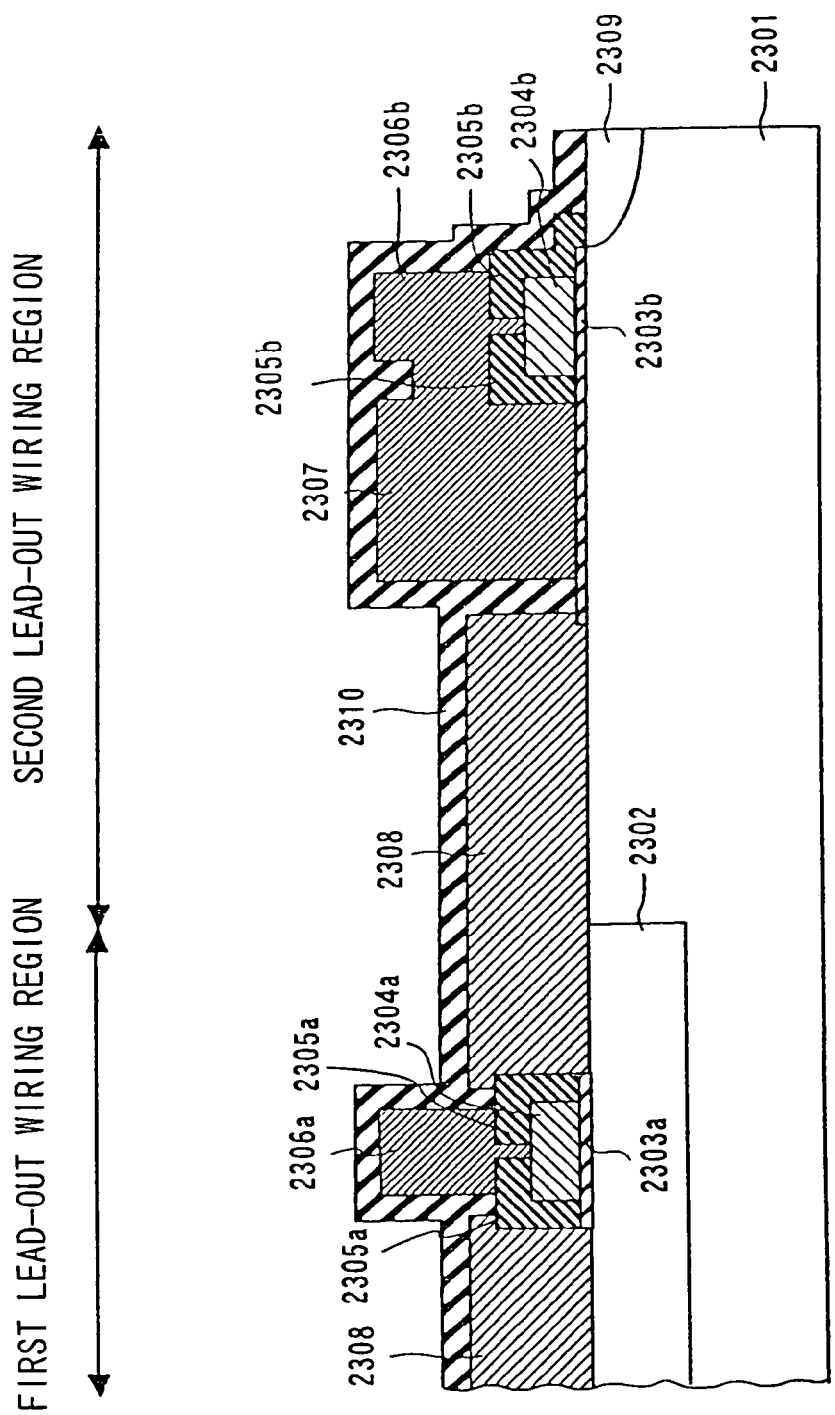
FIG. 24 is a fragmentary sectional view showing one step of the process of manufacturing the related semiconductor device.

Although the semiconductor device with an offset mesh trench structure in which a trench is formed in a mesh pattern is described in this embodiment, the present invention is not limited to this example, and a semiconductor device with a stripe trench structure in which a trench is formed in a striped pattern is also possible. Moreover, although, in this embodiment, as the structure of the first lead-out wiring region, the first embodiment (FIG. 1) in which the source electrode is not formed on the second gate wiring is used as shown in FIG. 11, the second embodiment (FIG. 10) in which the source electrode is formed on the second gate wiring as shown in FIG. 19 can be also used.

In the aforementioned first to third embodiments, a fault due to shock caused when the strap is bonded by ultrasonic bonding is described, but the present invention is not limited to this and has also a sufficient effect on shock caused by pressure welding bonding.

Moreover, the example in which the source electrode is composed of a double-layer electrode layer is described, but it may be composed of a one-layer electrode layer or a three or more layer electrode. Further, although the case where the source electrode is formed on the source region is explained, the source electrode may be a drain electrode, an emitter electrode, a collector electrode, or the like depending on the structure of a cell formed in the cell forming region.

What is claimed is:

1. A semiconductor device, comprising:
   a semiconductor layer which includes a first semiconductor region of a first conductivity type, a base region of a second conductivity type formed above the first semiconductor region, and a plurality of second semiconductor regions of the first conductivity type formed on the base region;
   at least one gate electrode which is formed between the first semiconductor region and the second semiconductor regions and which is adjacent to the first semiconductor region and the second semiconductor regions, the gate electrode facing the base region via a gate insulating film;
   a gate wiring which is formed on the semiconductor layer directly above a first insulating film and which is made of metal, the gate wiring being electrically connected to the gate electrode;
   a plurality of main electrodes which are electrically connected to the plurality of second semiconductor regions, wherein the gate wiring is arranged between the main electrodes and the gate wiring is separated from the main electrodes by a second insulating film; and
   a connecting plate which is connected onto upper surfaces of the main electrodes, wherein the main electrodes are in contact with a contact region of the connecting plate, and, in an area under the contact region of the connecting plate, the highest portion of an uppermost surface of the gate wiring is not higher than the upper surfaces of the main electrodes, wherein the connecting plate is connected to a lead frame and the gate wiring is not directly connected to the connecting plate,
   wherein the first insulating film is formed substantially midway between neighboring gate electrodes on the base region of the second conductivity type.

2. The semiconductor device according to claim 1, wherein uppermost surfaces of the plurality of main electrodes are a metal.

3. The semiconductor device according to claim 1, wherein the plurality of main electrodes are formed apart from the gate wiring with a gap therebetween.

4. The semiconductor device according to claim 1,
   wherein the main electrodes comprise a first main electrode layer and a second main electrode layer which is formed on the first main electrode layer.

5. The semiconductor device according to claim 4, wherein the second main electrode layer is electrically connected to the first main electrode layer via an opening formed in a fourth insulating film which is formed on the first main electrode layer.

6. The semiconductor device according to claim 4, wherein the second main electrode layer is thicker than the first main electrode layer.

7. The semiconductor device according to claim 1, wherein the upper surfaces of the main electrodes are higher than the highest portion of an uppermost surface of the gate wiring.

8. The semiconductor device according to claim 1, wherein the connecting plate is directly connected onto the upper surfaces of the main electrodes.

9. The semiconductor device according to claim 1, wherein a third insulating film is formed on the gate wiring so as to insulate the gate wiring from the connecting plate.

10. The semiconductor device according to claim 9, wherein the main electrodes are formed of a plurality of metal layers, and the third insulating film extends between the plurality of metal layers.

11. The semiconductor device according to claim 1, wherein the main electrodes comprises first electrodes and second electrodes which are formed above the first electrodes,
   upper surfaces of the second electrodes are directly connected to the connecting plate, and
   the highest portion of an uppermost surface of the gate wiring is not higher than the upper surfaces of the second electrodes.

12. The semiconductor device according to claim 1, wherein a plurality of gate electrodes are provided and the main electrodes are formed above the plurality of gate electrodes with a gap therebetween, and the gate wiring is arranged in the gap so that the gate wiring is not in contact with the connecting plate and the gate wiring is located between the plurality of gate electrodes, and
   the second semiconductor regions are formed on a first side of the plurality of gate electrodes and the second semiconductor regions are not formed on a second side of the plurality of gate electrodes, the second side of the plurality of gate electrodes is an inner side in which the gate wiring is located.

13. A semiconductor device, comprising:
   a first semiconductor region of a first conductive type;
   a second semiconductor region of a second conductive type, the second semiconductor region being formed above the first semiconductor region;
   a third semiconductor region of the first conductive type, the third semiconductor region being formed above the second semiconductor region;
   at least one gate electrode which is formed between the first semiconductor region and the third semiconductor region and which is adjacent to the first semiconductor region and the third semiconductor region, the gate electrode facing the second semiconductor region via a gate insulating film;
   a first main electrode which is divided into a plurality of first main electrode units, the first main electrode units being electrically connected to the second semiconductor region and the third semiconductor region;
   a metal gate wiring which is electrically connected to the gate electrode and which is arranged between the first main electrode units, wherein the metal gate wiring is formed on the second semiconductor region directly above a first insulating film, and is separated from the first main electrode by a second insulating film, the first insulating film being on the second semiconductor region;
   a lead frame; and
   a connecting plate which is connected to the first main electrode units and the lead frame by ultrasonic bonding so as to electrically connect the first main electrode units to the lead frame, the connecting plate being in the form of a plate, wherein the first main electrode units are connected to the connecting plate by the ultrasonic bonding such that the connecting plate covers at least a portion of the first main electrode units between which the metal gate wiring is arranged, and wherein the metal gate wiring is not directly connected to the connecting plate which is over the metal gate wiring,
   wherein the first insulating film is formed substantially midway between neighboring gate electrodes on the second semiconductor region of the second conductivity type.

14. The semiconductor device according to claim 13, wherein the highest portion of an uppermost surface of the metal gate wiring is lower than a bottom surface of a portion of the connecting plate which is over the metal gate wiring.

15. The semiconductor device according to claim 14, wherein the highest portion of the uppermost surface of the metal gate wiring is lower than an upper surfaces of the first main electrode units.

16. The semiconductor device according to claim 14, wherein a second insulating film is formed between the metal gate wiring and the connecting plate.

17. The semiconductor device according to claim 14, further comprising a fourth semiconductor region of the second conductive type, the fourth semiconductor region being formed on a side of the first semiconductor region which is opposite to the second semiconductor region.

18. The semiconductor device according to claim 14, further comprising a second main electrode which is formed on a side of the first semiconductor region which is opposite to the second semiconductor region, the second main electrode being electrically connected to the first semiconductor region.

19. The semiconductor device according to claim 17, further comprising a second main electrode which is formed on a side of the fourth semiconductor region which is opposite to the first semiconductor region, the second main electrode being electrically connected to the fourth semiconductor region.

20. The semiconductor device according to claim 14, wherein the gate electrode is formed in a trench with the gate insulating film, wherein the trench passes through the second semiconductor region so as to reach the first semiconductor region.

21. The semiconductor device according to claim 14, wherein the connecting plate is made of aluminum.

22. The semiconductor device according to claim 14, wherein the connecting plate covers a major part of the first main electrode units.

23. The semiconductor device according to claim 14, wherein a gap is formed between the first main electrode units and the metal gate wiring.

24. The semiconductor device according to claim 14, wherein the connecting plate is directly connected to the first main electrode units and the lead frame.

25. The semiconductor device according to claim 18, wherein the semiconductor device is a vertical MOSFET.

26. The semiconductor device according to claim 19, wherein the semiconductor device is an IGBT.

27. The semiconductor device according to claim 13, wherein a plurality of gate electrodes are provided and the main electrode units are formed above the plurality of gate electrodes with a gap therebetween, and the gate wiring is arranged in the gap so that the gate wiring is not in contact with the connecting plate and the gate wiring is located between the plurality of gate electrodes, and the second semiconductor regions are formed on a first side of the plurality of gate electrodes and the second semiconductor regions are not formed on a second side of the plurality of gate electrodes, the second side of the plurality of gate electrodes is an inner side in which the gate wiring is located.

* * * * *